United States Patent
Said et al.

(10) Patent No.: US 11,482,531 B2
(45) Date of Patent: Oct. 25, 2022

(54) THREE-DIMENSIONAL MEMORY DEVICE INCLUDING MULTI-BIT CHARGE STORAGE ELEMENTS AND METHODS FOR FORMING THE SAME

(71) Applicant: SANDISK TECHNOLOGIES LLC, Addison, TX (US)

(72) Inventors: Ramy Nashed Bassely Said, San Jose, CA (US); Jiahui Yuan, Fremont, CA (US); Senaka Kanakamedala, San Jose, CA (US); Raghuveer S. Makala, Campbell, CA (US); Dana Lee, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/169,987

(22) Filed: Feb. 8, 2021

(65) Prior Publication Data

US 2022/0254797 A1 Aug. 11, 2022

(51) Int. Cl.
*H01L 29/788* (2006.01)
*H01L 27/11556* (2017.01)
*H01L 29/423* (2006.01)
*H01L 29/66* (2006.01)

(52) U.S. Cl.
CPC .. *H01L 27/11556* (2013.01); *H01L 29/42324* (2013.01); *H01L 29/66825* (2013.01); *H01L 29/788* (2013.01)

(58) Field of Classification Search
CPC ...... C04B 37/025; H01L 23/15; H01L 23/142
See application file for complete search history.

(56) References Cited

U.S. PATENT DOCUMENTS

| | | | |
|---|---|---|---|
| 8,349,681 B2* | 1/2013 | Alsmeier | H01L 29/66825 257/E21.309 |
| 8,658,499 B2 | 2/2014 | Makala et al. | |
| 9,252,151 B2 | 2/2016 | Chien et al. | |
| 9,356,031 B2 | 5/2016 | Lee et al. | |
| 9,397,093 B2 | 7/2016 | Makala et al. | |
| 9,419,012 B1 | 8/2016 | Shimabukuro et al. | |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Eugene Lee
(74) *Attorney, Agent, or Firm* — The Marbury Law Group PLLC

(57) ABSTRACT

A three-dimensional memory device includes an alternating stack of insulating layers and electrically conductive layers located over a substrate, memory stack structures extending through the alternating stack. Each of the memory stack structures includes a vertical semiconductor channel, a tunneling dielectric layer, and a vertical stack of memory elements located at levels of the electrically conductive layers between a respective vertically neighboring pair of the insulating layers. Each of the memory elements includes a first memory material portion, and a second memory material portion that is vertically spaced from and is electrically isolated from the first memory material portion by at least one blocking dielectric material portion.

13 Claims, 35 Drawing Sheets

(56) References Cited

U.S. PATENT DOCUMENTS

| | | | |
|---|---|---|---|
| 9,576,975 | B2 | 2/2017 | Zhang et al. |
| 9,620,514 | B2 | 4/2017 | Kai et al. |
| 9,627,399 | B2 | 4/2017 | Kanakamedala et al. |
| 9,659,955 | B1 | 5/2017 | Sharangpani et al. |
| 9,666,594 | B2 | 5/2017 | Mizuno et al. |
| 9,728,546 | B2 | 8/2017 | Serov et al. |
| 9,837,431 | B2 | 12/2017 | Nishikawa et al. |
| 9,875,929 | B1 | 1/2018 | Shukla et al. |
| 9,935,123 | B2 | 4/2018 | Nishikawa et al. |
| 9,935,124 | B2 | 4/2018 | Nishikawa et al. |
| 9,991,277 | B1 | 6/2018 | Tsutsumi et al. |
| 10,115,897 | B1 * | 10/2018 | Sato ............. H01L 45/1226 |
| 10,249,683 | B1 * | 4/2019 | Lille ............. H01L 45/1253 |
| 10,373,696 | B2 | 8/2019 | Zhang et al. |
| 10,381,376 | B1 | 8/2019 | Nishikawa et al. |
| 10,516,025 | B1 | 12/2019 | Nishikawa et al. |
| 10,559,588 | B2 | 2/2020 | Dong et al. |
| 10,593,693 | B2 * | 3/2020 | Yamazaki ........ H01L 27/2454 |
| 10,622,368 | B2 | 4/2020 | Kanakamedala et al. |
| 10,700,078 | B1 | 6/2020 | Cui et al. |
| 10,700,086 | B2 | 6/2020 | Makala et al. |
| 10,700,090 | B1 | 6/2020 | Cui et al. |
| 10,720,444 | B2 | 7/2020 | Nishikawa et al. |
| 11,121,140 | B2 * | 9/2021 | Yang ................ H01L 45/04 |
| 2014/0225181 | A1 | 8/2014 | Makala et al. |
| 2015/0132906 | A1 | 5/2015 | Chang et al. |
| 2015/0287734 | A1 | 10/2015 | Simek-Ege et al. |
| 2016/0043093 | A1 | 2/2016 | Lee et al. |
| 2016/0071860 | A1 | 3/2016 | Kai et al. |
| 2016/0071861 | A1 | 3/2016 | Serov et al. |
| 2016/0071876 | A1 | 3/2016 | Mizuno et al. |
| 2017/0025431 | A1 | 1/2017 | Kanakamedala et al. |
| 2017/0125436 | A1 | 5/2017 | Sharangpani et al. |
| 2017/0148805 | A1 | 5/2017 | Nishikawa et al. |
| 2017/0148808 | A1 | 5/2017 | Nishikawa et al. |
| 2017/0148809 | A1 | 5/2017 | Nishikawa et al. |
| 2018/0138194 | A1 | 5/2018 | Shigemura et al. |
| 2018/0151588 | A1 | 5/2018 | Tsutsumi et al. |
| 2019/0074441 | A1 * | 3/2019 | Kikuchi ........... H01L 45/1253 |
| 2019/0214395 | A1 | 7/2019 | Zhang et al. |
| 2019/0221575 | A1 | 7/2019 | Dong et al. |
| 2019/0252405 | A1 | 8/2019 | Tsutsumi et al. |
| 2019/0371803 | A9 | 12/2019 | Kanakamedala et al. |
| 2019/0386108 | A1 | 12/2019 | Nishikawa |
| 2020/0006375 | A1 | 1/2020 | Zhou et al. |
| 2020/0006376 | A1 | 1/2020 | Makala et al. |
| 2020/0058672 | A1 | 2/2020 | Nishikawa et al. |
| 2020/0227432 | A1 | 7/2020 | Lai et al. |

OTHER PUBLICATIONS

Yang, X., et al. "Dry etching of Al2O3 thin films in O2/BCl3/Ar inductively coupled plasma," Trans. Electr. Electron. Mater 11.5, pp. 202-205, (2010).

Boaz, E. et al., "4-bit per cell NROM reliability," IEEE International Electron Devices Meeting, 2005. IEDM Technical Digest. IEEE, (2005).

Boaz, E. et al., "NROM: A novel localized trapping, 2-bit nonvolatile memory cell," IEEE Electron Device Letters 21.11, pp. 543-545, (2000).

U.S. Appl. No. 16/142,447, filed Sep. 26, 2018, SanDisk Technologies LLC.

U.S. Appl. No. 16/423,500, filed May 28, 2019, SanDisk Technologies LLC.

U.S. Appl. No. 16/582,262, filed Sep. 25, 2019, SanDisk Technologies LLC.

U.S. Appl. No. 16/707,541, filed Dec. 9, 2019, SanDisk Technologies LLC.

U.S. Appl. No. 16/794,536, filed Feb. 19, 2020, SanDisk Technologies LLC.

U.S. Appl. No. 16/794,563, filed Feb. 19, 2020, SanDisk Technologies LLC.

U.S. Appl. No. 16/801,456, filed Feb. 26, 2020, SanDisk Technologies LLC.

U.S. Appl. No. 16/849,600, filed Apr. 15, 2020, SanDisk Technologies LLC.

U.S. Appl. No. 16/849,664, filed Apr. 15, 2020, SanDisk Technologies LLC.

U.S. Appl. No. 16/876,816, filed May 18, 2020, SanDisk Technologies LLC.

U.S. Appl. No. 16/876,877, filed May 18, 2020, SanDisk Technologies LLC.

U.S. Appl. No. 16/985,335, filed Aug. 5, 2020, SanDisk Technologies LLC.

U.S. Appl. No. 17/001,003, filed Aug. 24, 2020, SanDisk Technologies LLC.

U.S. Appl. No. 17/090,420, filed Nov. 5, 2020, SanDisk Technologies LLC.

U.S. Appl. No. 17/119,002, filed Dec. 11, 2020, SanDisk Technologies LLC.

U.S. Appl. No. 17/119,051, filed Dec. 11, 2020, SanDisk Technologies LLC.

U.S. Appl. No. 17/122,360, filed Dec. 15, 2020, SanDisk Technologies LLC.

Notification of Transmittal of the International Search Report and the Written Opinion of the International Searching Authority for International Patent Application No. PCT/US2021/037288, dated Nov. 1, 2021, 8 pages.

\* cited by examiner

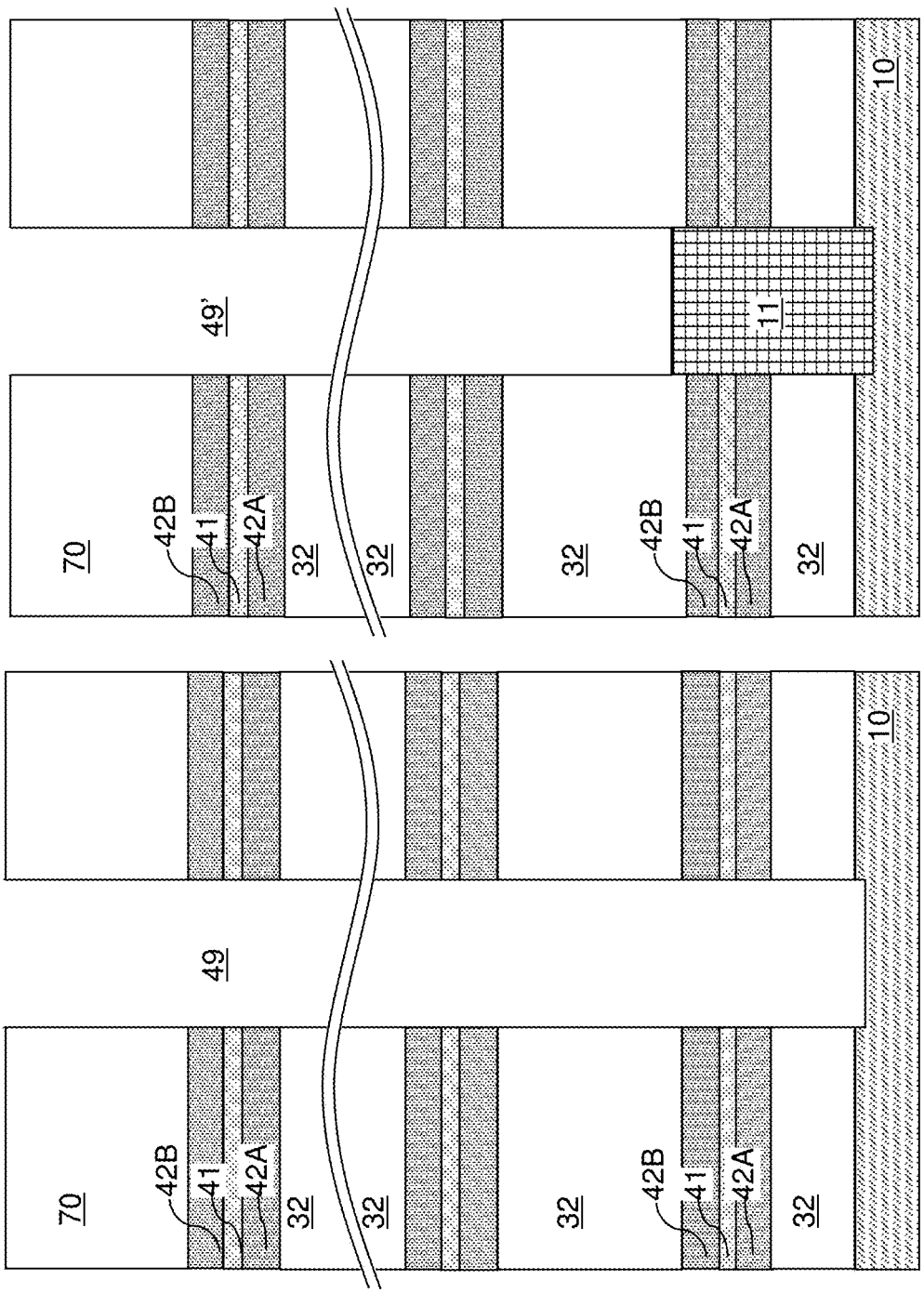

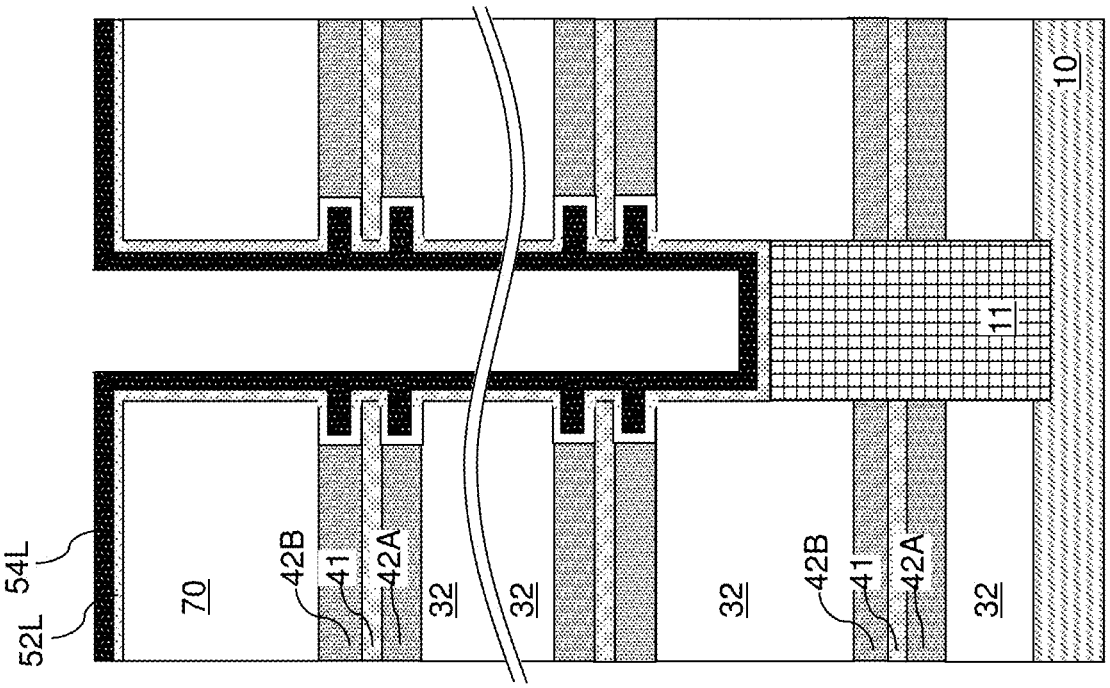
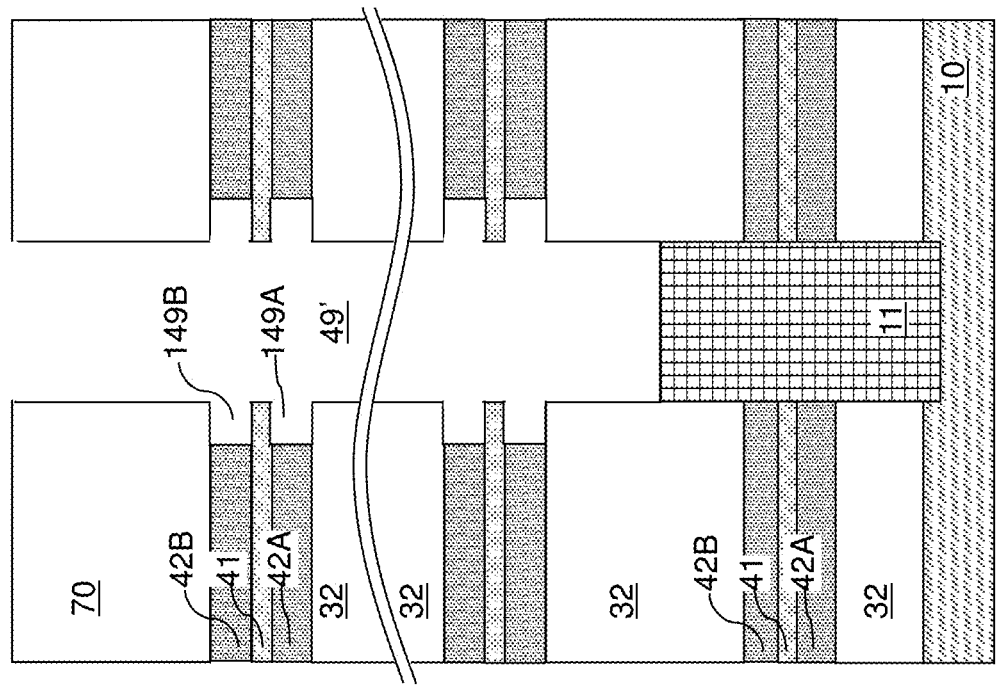
FIG. 5D
FIG. 5C

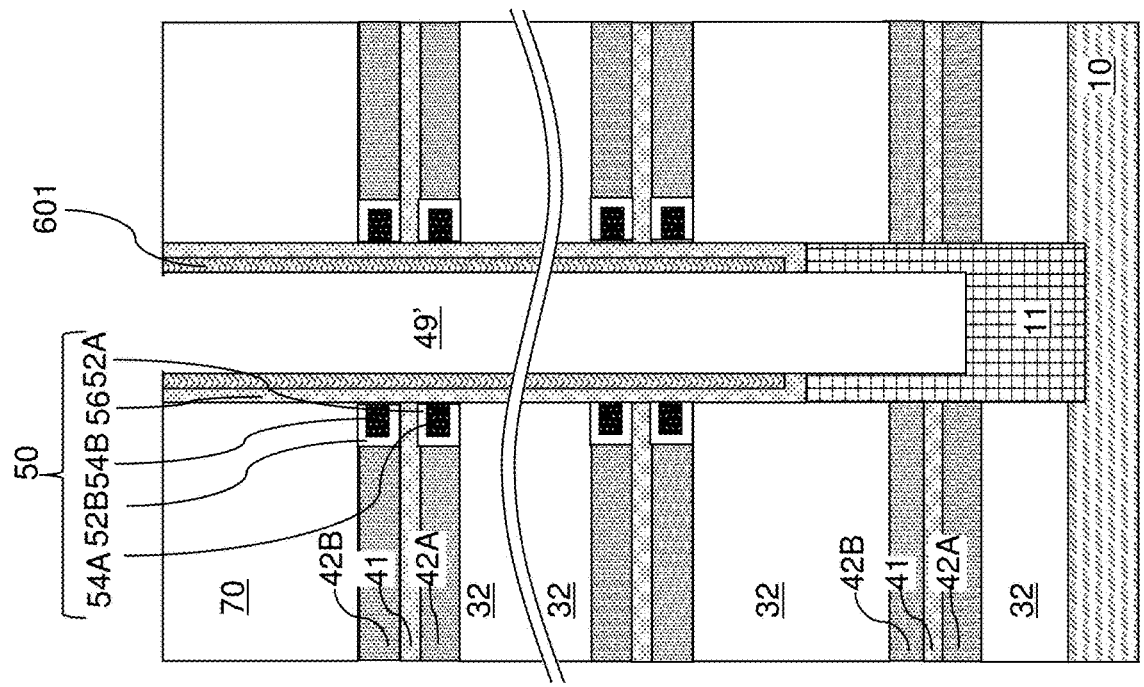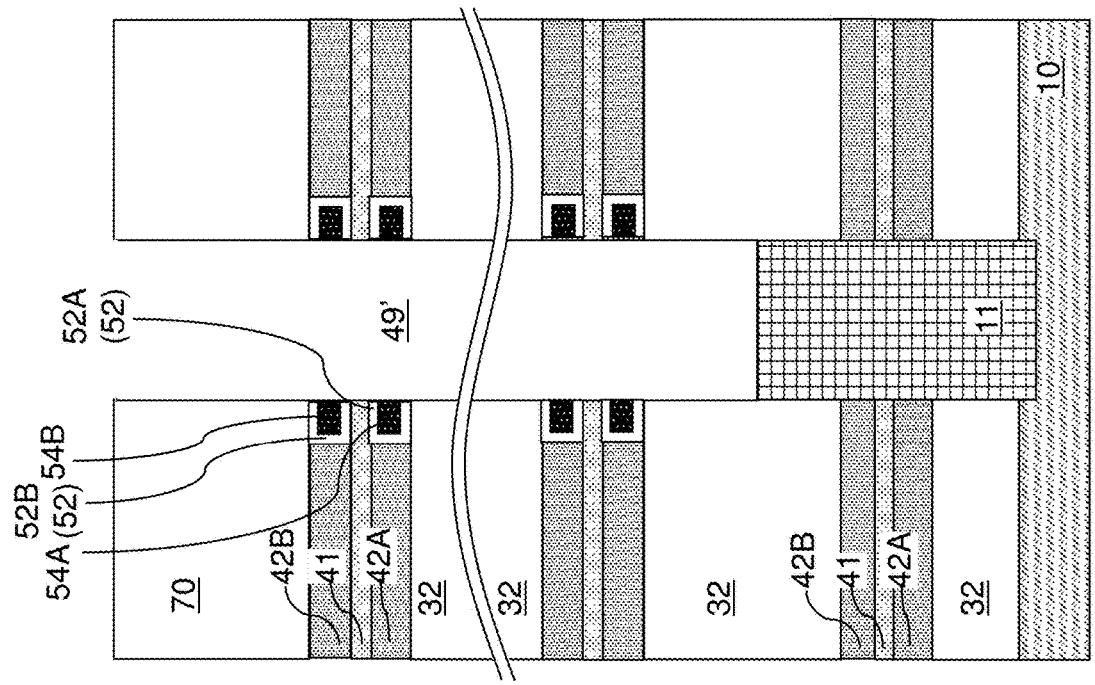

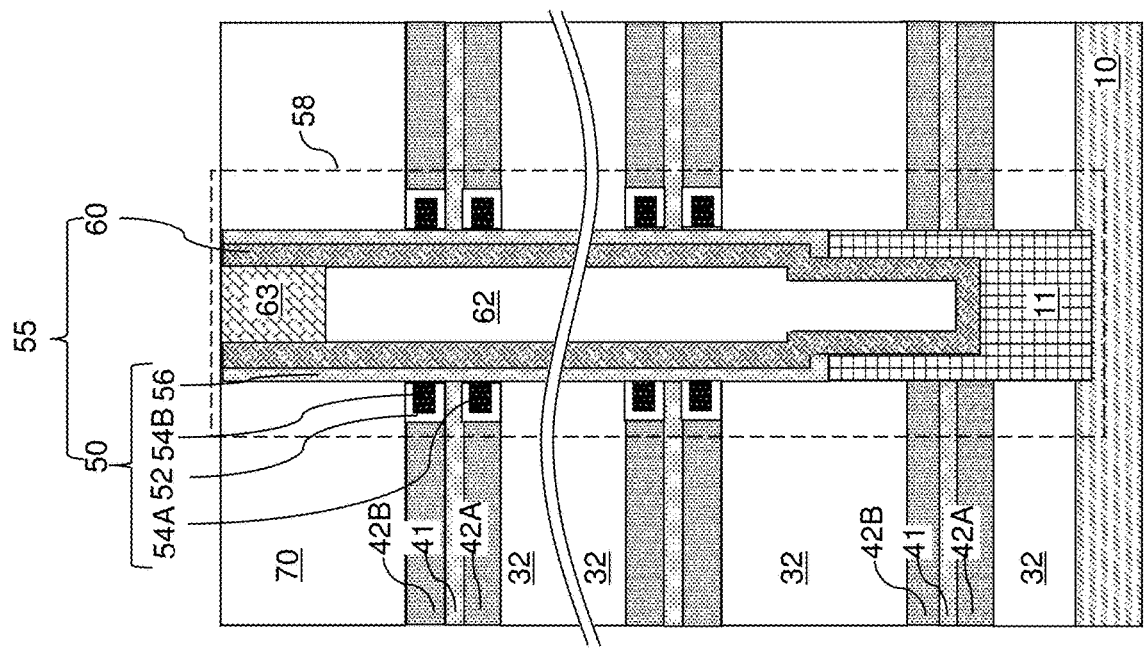
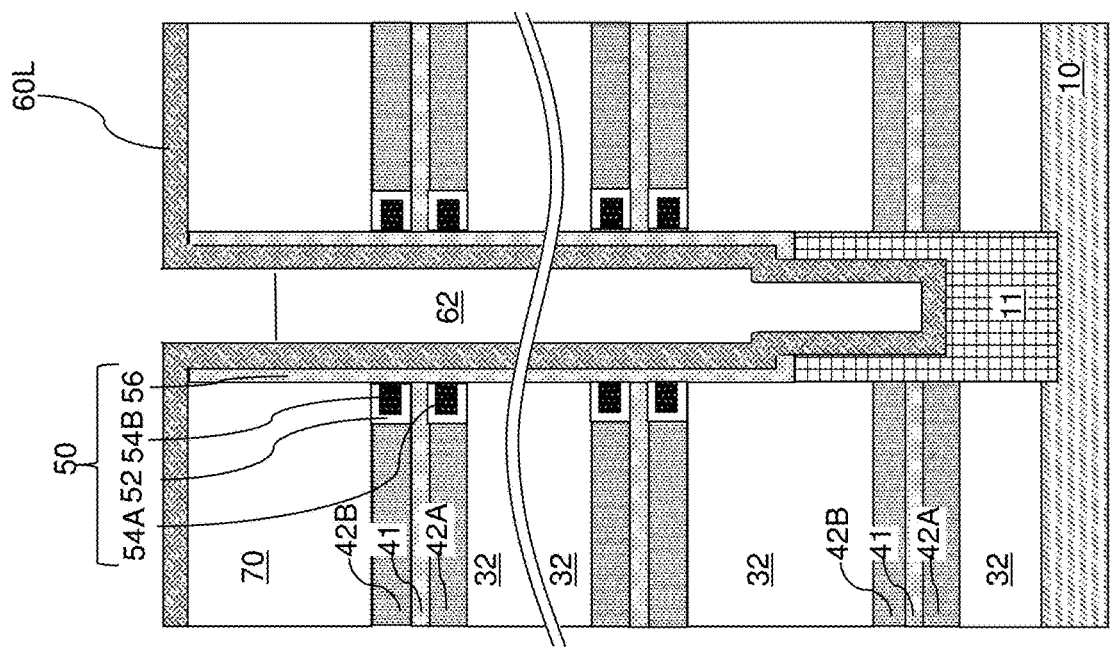

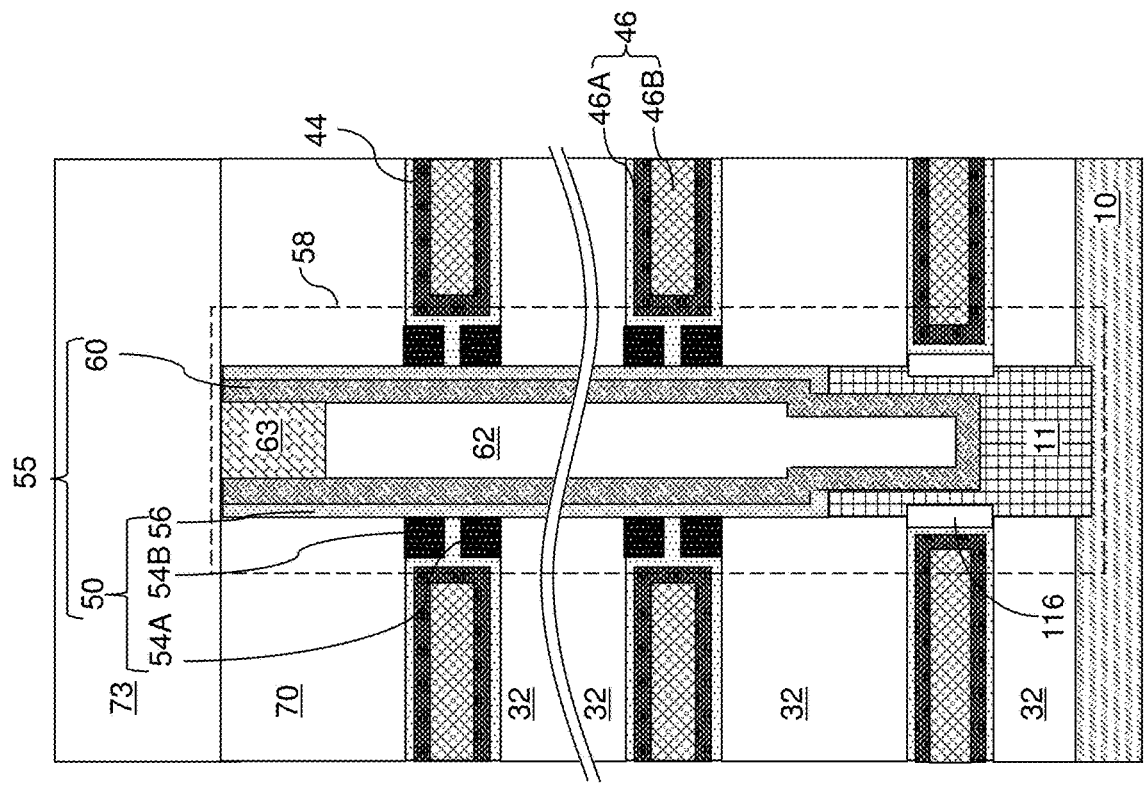
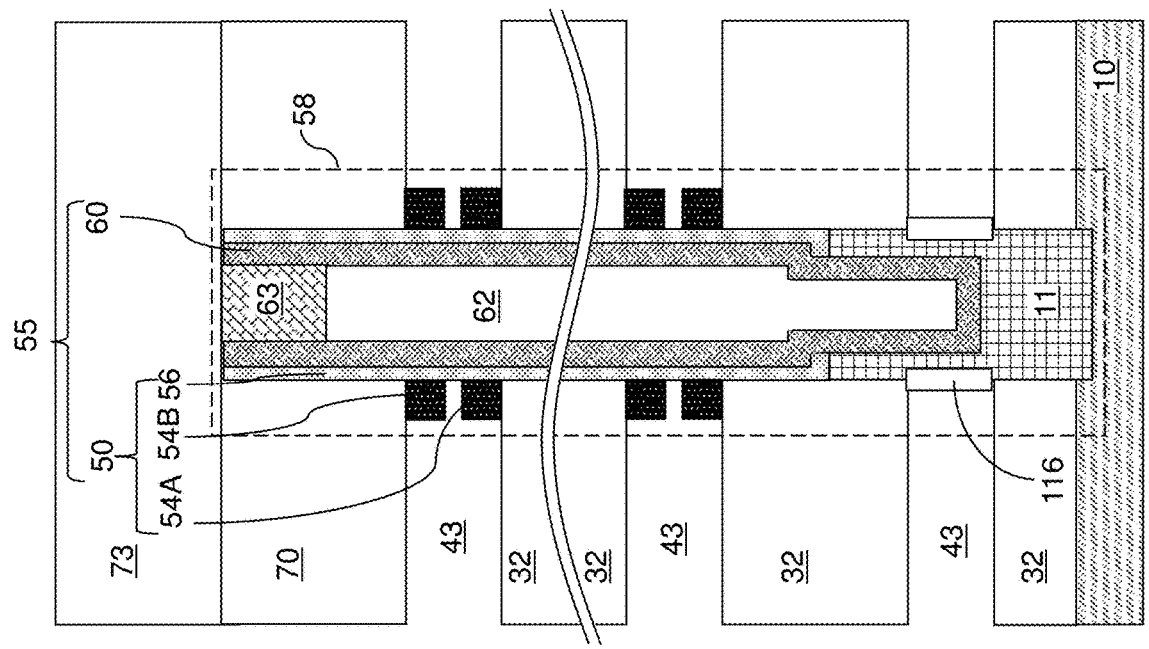
FIG. 15B
FIG. 15A

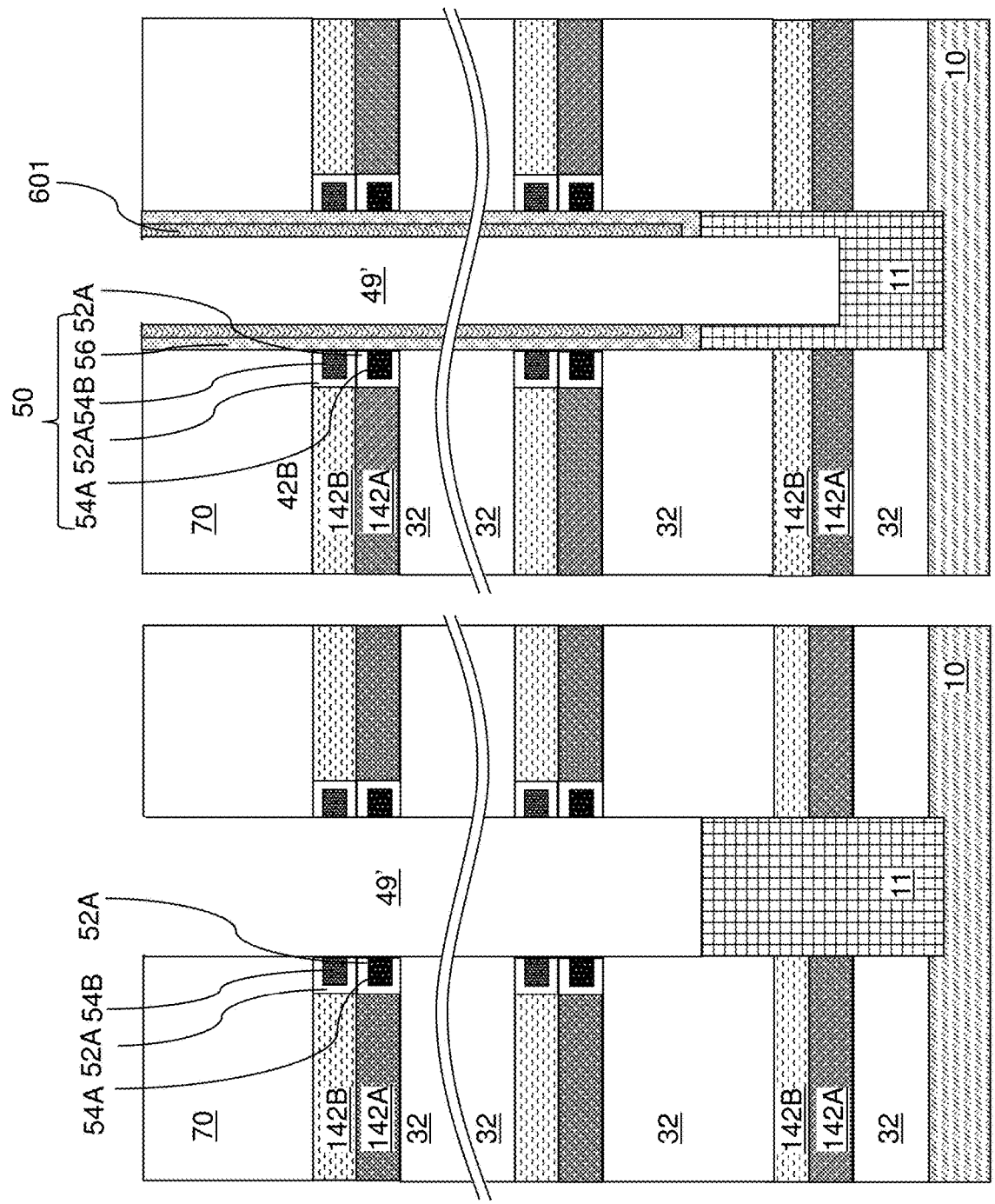

ID CARD 11,482,531 B2

THREE-DIMENSIONAL MEMORY DEVICE INCLUDING MULTI-BIT CHARGE STORAGE ELEMENTS AND METHODS FOR FORMING THE SAME

FIELD

The present disclosure relates generally to the field of semiconductor devices, and particular to a three-dimensional memory device employing multi-bit charge storage elements and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; memory stack structures extending through the alternating stack, wherein each of the memory stack structures comprises a vertical semiconductor channel, a tunneling dielectric layer, and a vertical stack of memory elements located at levels of the electrically conductive layers between a respective vertically neighboring pair of the insulating layers, wherein each of the memory elements is located at a level of a respective one of the electrically conductive layers between the respective vertically neighboring pair of the insulating layers, and each of the memory elements comprises a first memory material portion; and a second memory material portion that is vertically spaced from and is electrically isolated from the first memory material portion by at least one blocking dielectric material portion.

According to another aspect of the present disclosure, a method of forming a three-dimensional memory device is provided, which comprises: forming a vertical sequence of a unit layer stack over a substrate, wherein the unit layer stack comprises a first sacrificial material layer, a second sacrificial material layer, and an insulating layer; forming memory openings through the vertical sequence; forming first lateral recesses by laterally recessing each of the first sacrificial material layers around each of the memory openings; forming second lateral recesses by laterally recessing each of the second sacrificial material layers around each of the memory openings concurrently with, prior to, or after, formation of the first lateral recesses; forming first memory material portions in the first lateral recesses; forming second memory material portions in the second lateral recesses concurrently with, prior to, or after, formation of the first memory material portions; and replacing the first sacrificial material layers and the second sacrificial material layers with electrically conductive layers.

BRIEF DESCRIPTION OF THE DRAWINGS

FIGS. 5A-5J are sequential schematic vertical cross-sectional views of a memory opening within the first exemplary structure during formation of a memory opening fill structure according to the first embodiment of the present disclosure.

FIGS. 15A and 15B are sequential vertical cross-sectional views of a region around a memory opening fill structure of the alternative embodiment of the first exemplary structure during formation of electrically conductive layers according to the first embodiment of the present disclosure.

FIGS. 18A-18H are sequential schematic vertical cross-sectional views of a memory opening within the second exemplary structure during formation of a memory opening fill structure according to the second embodiment of the present disclosure.

DETAILED DESCRIPTION

Figure 1:
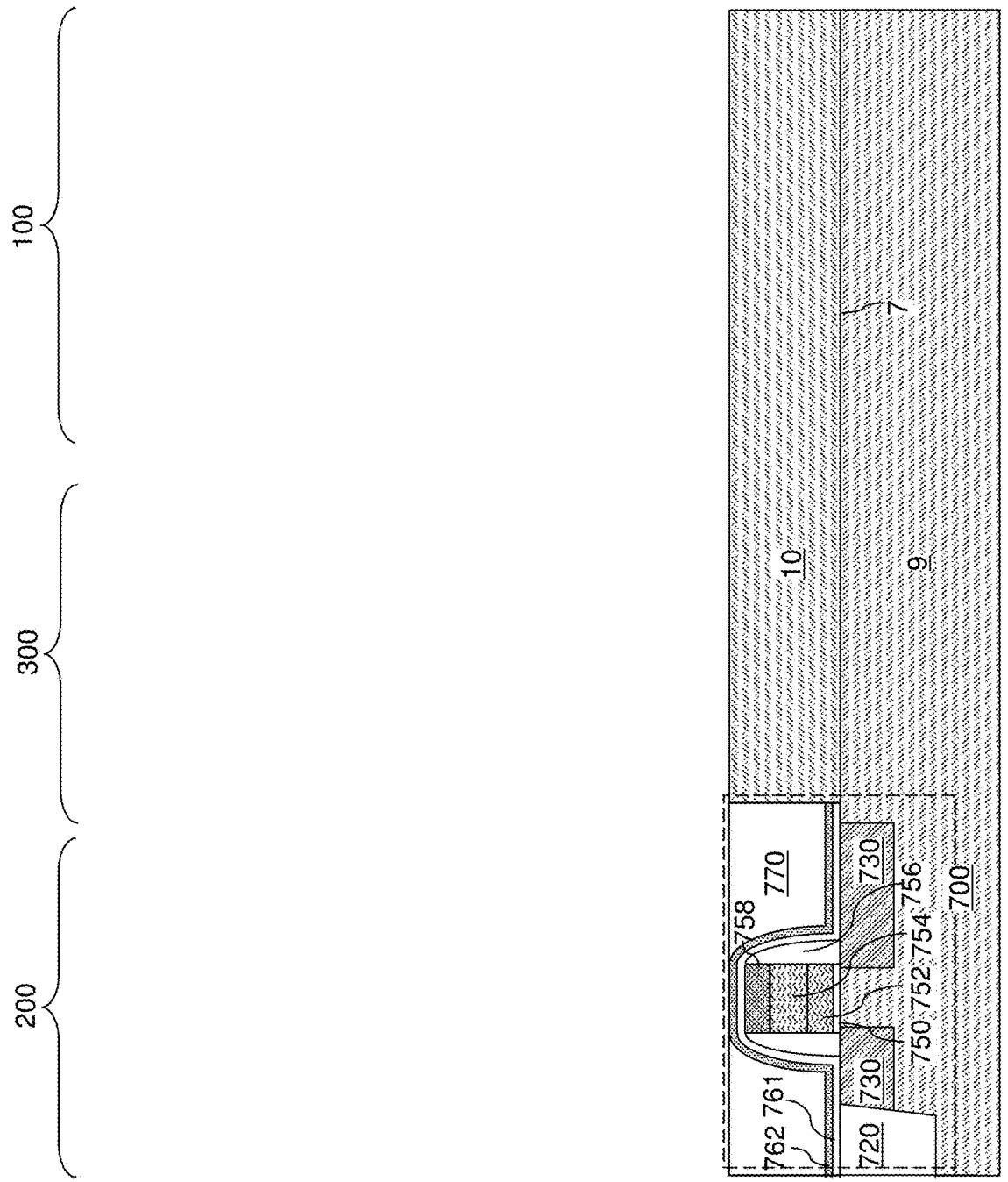
FIG. 1 is a schematic vertical cross-sectional view of a first exemplary structure after formation of at least one peripheral device and a semiconductor material layer according to a first embodiment of the present disclosure.

As discussed above, the present disclosure is directed to a three-dimensional memory device employing multi-bit charge storage elements and methods of manufacturing the same, the various aspects of which are described below. The embodiments of the disclosure can be employed to form various structures including a multilevel memory structure, non-limiting examples of which include semiconductor devices such as three-dimensional memory array devices comprising a plurality of memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased in a single erase operation. Each block contains a number of pages, which are the smallest unit that can be programmed, i.e., a smallest unit on which a read operation can be performed.

Referring to FIG. 1, a first exemplary structure according to the first embodiment of the present disclosure is illustrated, which can be employed, for example, to fabricate a device structure containing three-dimensional memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atom. Silicon dioxide is preferred. In an illustrative example, the first dielectric liner 761 can be a silicon oxide layer, and the second dielectric liner 762 can be a silicon nitride layer. The at least one semiconductor device for the peripheral circuitry can contain a driver circuit for memory devices to be subsequently formed. In one embodiment, the peripheral circuit can be configured to perform program (i.e., write), erase and read operations on each memory element within memory stack structures to be subsequently formed.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
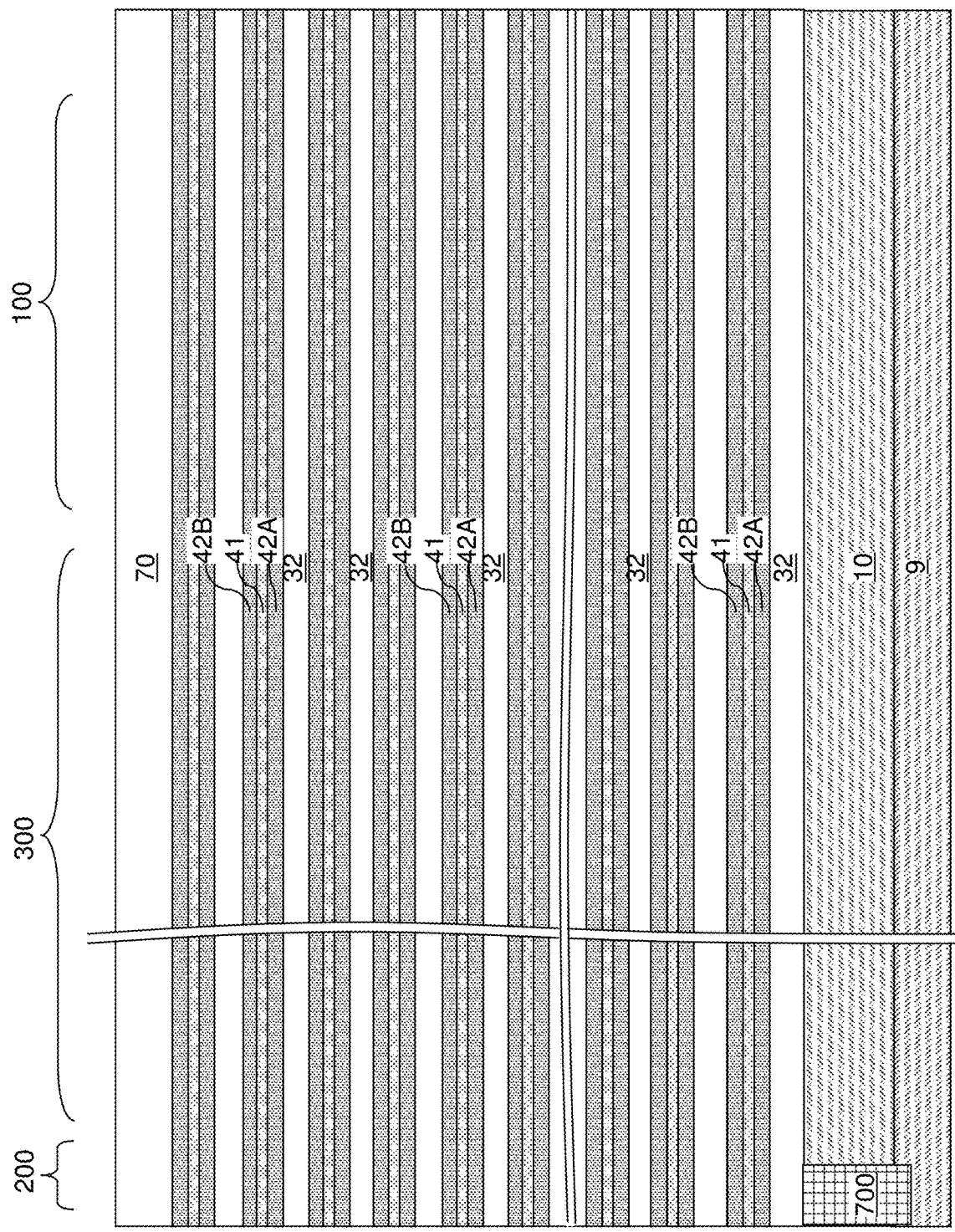
FIG. 2 is a schematic vertical cross-sectional view of the first exemplary structure after formation of a vertical sequence of a unit layer stack each including a first sacrificial material layer, a spacer sacrificial material layer, a second sacrificial material layer, and an insulating layer according to the first embodiment of the present disclosure.

Referring to FIG. 2, a vertical sequence of a unit layer stack (32, 42A, 41, 42B) can be formed over the semiconductor material layer 10. Each unit layer stack (32, 42A, 41, 42B) can include, from bottom to top, an insulating layer 32, a first sacrificial material layer 42A, a spacer sacrificial material layer 41, and a second sacrificial material layer 42B. Alternatively, each unit layer stack (32, 42A, 41, 42B) can include, from bottom to top, a first sacrificial material layer 42A, a spacer sacrificial material layer 41, a second sacrificial material layer 42B, and an insulating layer 32. The spacer sacrificial material layer 41 can be located between the first sacrificial material layer 42A and the second sacrificial material layer 42B within each unit layer stack (32, 42A, 41, 42B). Generally, the materials of the first sacrificial material layers 42A, the spacer sacrificial material layers 41, and the second sacrificial material layers 42B are different from the material of the insulating layers 32, and are selected such that the first sacrificial material layers 42A, the spacer sacrificial material layers 41, and the second sacrificial material layers 42B can be removed selective to the material of the insulating layers 32. Further, the materials of the first sacrificial material layers 42A and the second sacrificial material layers 42B are selected such that the first sacrificial material layers 42A and the second sacrificial material layers 42B can be removed selective to the spacer sacrificial material layers 41. Thus, the spacer sacrificial material layers 41 have a different material composition than the first sacrificial material layers 42A and the second sacrificial material layers 42B. The second sacrificial material layers 42B may have the same material composition as, or may have a different material composition than, the first sacrificial material layers 42A.

In one embodiment, the insulating layers 32 can include undoped silicate glass (i.e., silicon oxide) or a doped silicate glass, the first sacrificial material layers 42A and the second sacrificial material layers 42B can include silicon nitride, and the spacer sacrificial material layers 41 can include a semiconductor material (such as amorphous silicon, polysilicon, or a silicon-germanium alloy).

In another embodiment, the insulating layers 32 can include undoped silicate glass or a doped silicate glass, the spacer sacrificial material layers 41 can include silicon nitride, and the first sacrificial material layers 42A and the second sacrificial material layers 42B can include silicon nitride having a higher etch rate than the silicon nitride of the spacer sacrificial material layers 41. For example, the first and second sacrificial material layers (42A, 42B) may include a more porous silicon nitride material having a density in a range from 2.34 g/cm$^3$ to 2.58 g/cm$^3$. Such a porous silicon nitride material may be deposited by a plasma enhanced chemical vapor deposition process in which a higher plasma power is employed, can have a refractive index in a range from 1.74 to 1.90, and can have an etch rate in a range from 5 nm/min to 90 nm/min in a 100:1 dilute hydrofluoric acid at room temperature. In contrast, the spacer sacrificial material layers 41 may include a non-porous silicon nitride material or a less porous silicon nitride material having a greater density than the more porous silicon nitride material of the first and second sacrificial silicon material layers (42A, 42B). In one embodiment, the spacer sacrificial material layers 41 can have a density in a range from 2.45 g/cm$^3$ to 2.65 g/cm$^3$, such as from 2.59 g/cm$^3$ to 2.65 g/cm$^3$. Such non-porous silicon nitride material may be deposited by a plasma enhanced chemical vapor deposition process in which a lower plasma power is employed, can have a refractive index in a range from 1.82 to 1.94, and can have an etch rate in a range from 2.5 nm/min to 25 nm/min, such as from 2.5 nm/min to 5 nm/min, in a 100:1 dilute hydrofluoric acid at room temperature.

In another embodiment, the insulating layers 32 can include undoped silicate glass or a doped silicate glass, the spacer sacrificial material layers 41 can include undoped silicate glass or a doped silicate glass having a higher etch rate than the insulating layers, and the first sacrificial material layers 42A and the second sacrificial material layers 42B can include silicon nitride. In another embodiment, the insulating layers 32 can include undoped silicate glass or a doped silicate glass, the spacer sacrificial material layers 41 can include any material other than silicon oxide or silicon nitride (e.g., hafnium oxide, silicon oxynitride, aluminum oxide, polysilicon, amorphous silicon, silicon germanium, etc.), and the first sacrificial material layers 42A and the second sacrificial material layers 42B can include silicon nitride.

Each spacer sacrificial material layer 41 may be thinner than each of the first and second sacrificial material layers (42A, 42B). The thicknesses of each insulating layers 32 can be in a range from 20 nm to 50 nm, although lesser and greater thicknesses can also be employed. The thickness of each of the first sacrificial material layers 42A and the second sacrificial material layers 42B can be in a range from 8 nm to 30 nm, such as from 10 nm to 20 nm, although lesser and greater thicknesses may also be employed. The thickness of each spacer sacrificial material layer 41 can be in a range from 4 nm to 15 nm, although lesser and greater thicknesses may also be employed. The number of repetitions of the unit layer stack (32, 42A, 41, 42B) with the vertical sequence can be in a range from 2 to 1,024, and typically from 8 to 256, although a greater number of repetitions can also be employed. In one embodiment, each layer within the vertical sequence can have a uniform thickness that is substantially invariant within lateral translation.

Optionally, an insulating cap layer 70 can be formed over the vertical sequence (32, 42A, 41, 42B). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
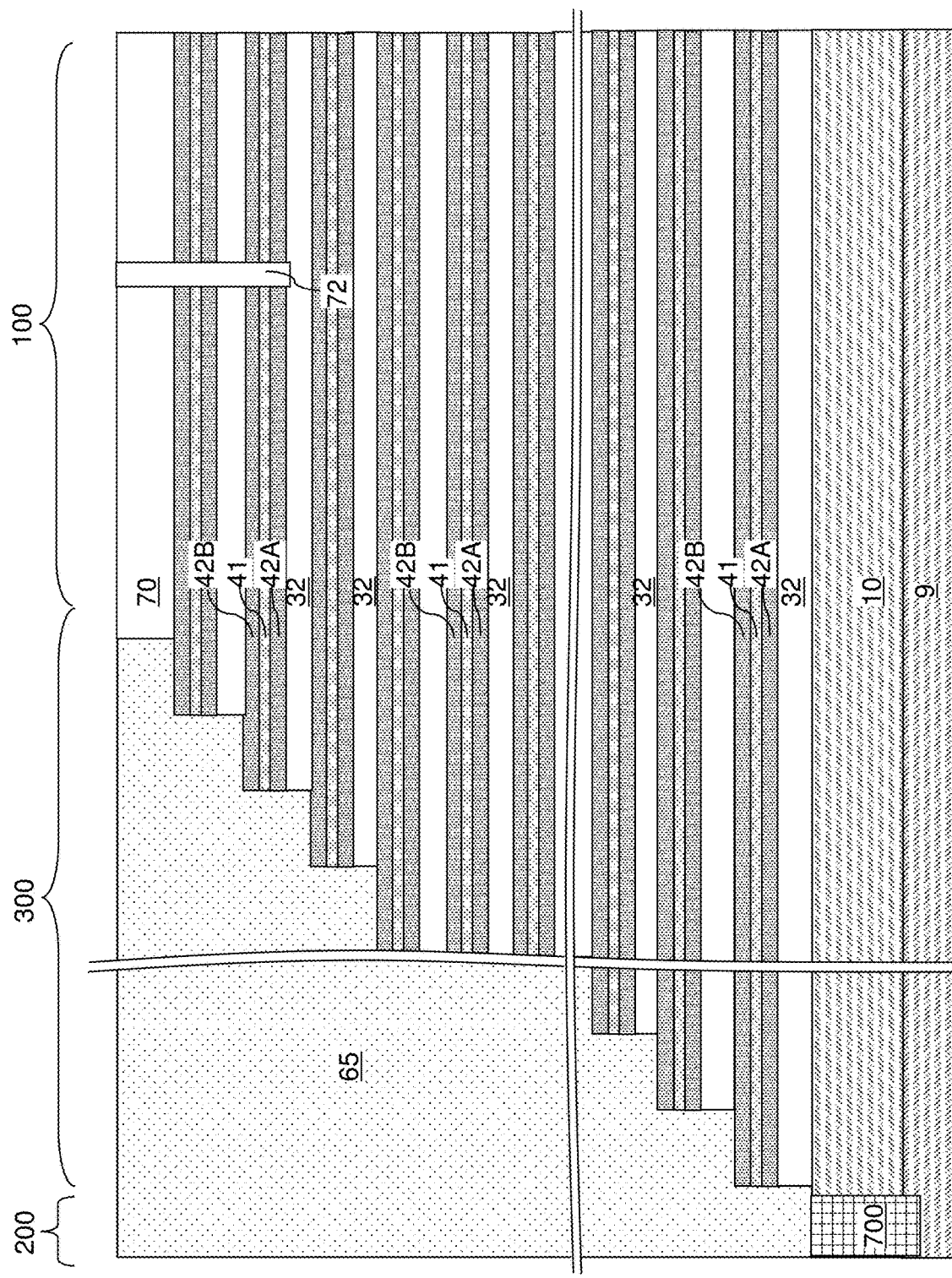
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the vertical sequence (32, 42A, 41, 42B), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the vertical sequence (32, 42A, 41, 42B) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure. In the terrace region, each unit layer stack other than a topmost unit layer stack within the vertical sequence (32, 42A, 41, 42B) laterally extends farther than any overlying unit layer stack within the vertical sequence (32, 42A, 41, 42B) in the terrace region. The terrace region can include stepped surfaces of the vertical sequence (32, 42A, 41, 42B) that continuously extend from a bottommost layer within the vertical sequence (32, 42A, 41, 42B) to a topmost layer within the vertical sequence (32, 42A, 41, 42B).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers (42A, 42B) located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
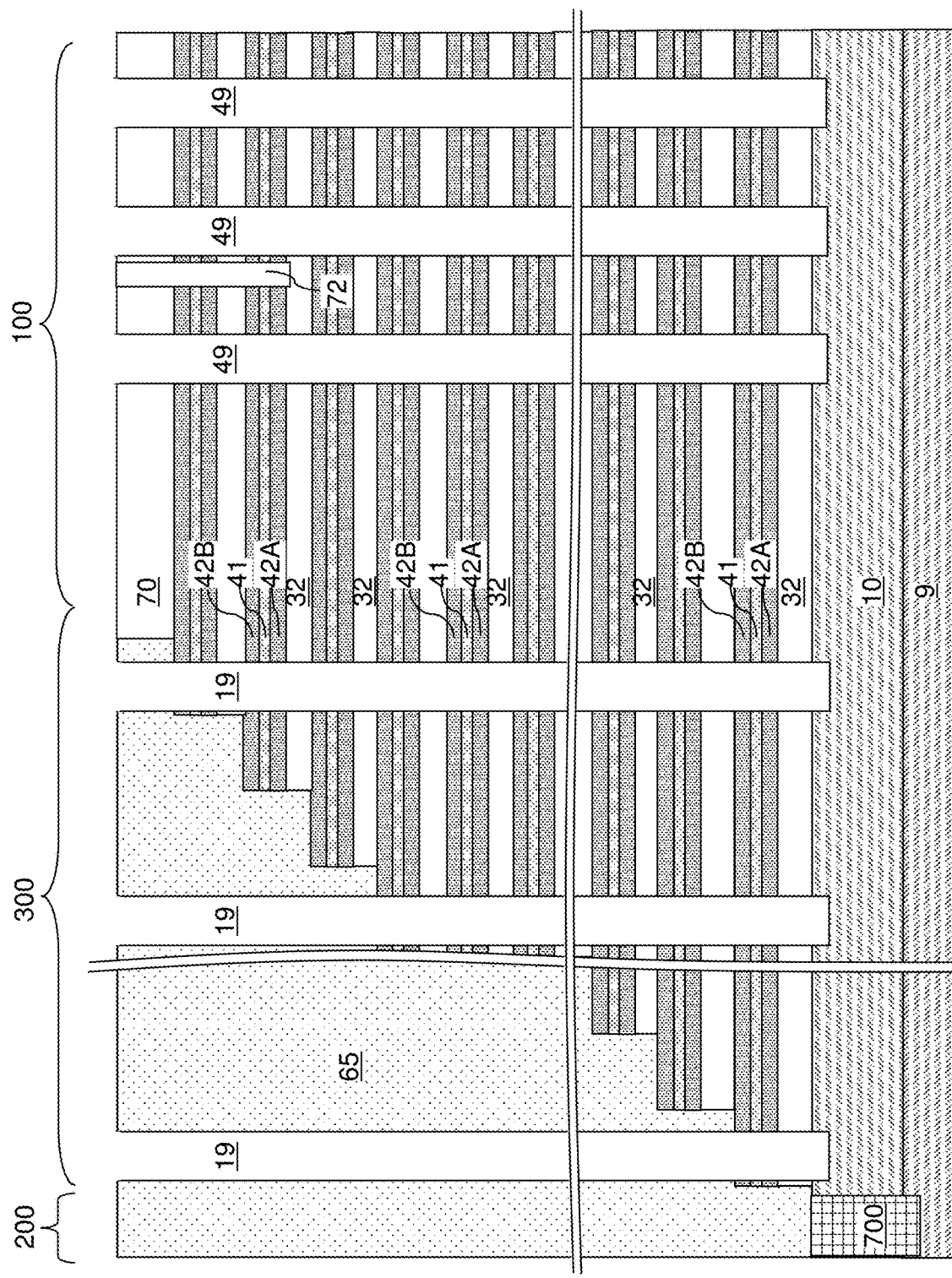
FIG. 4A is a schematic vertical cross-sectional view of the first exemplary structure after formation of memory openings and support openings according to the first embodiment of the present disclosure.
Figure 4B:
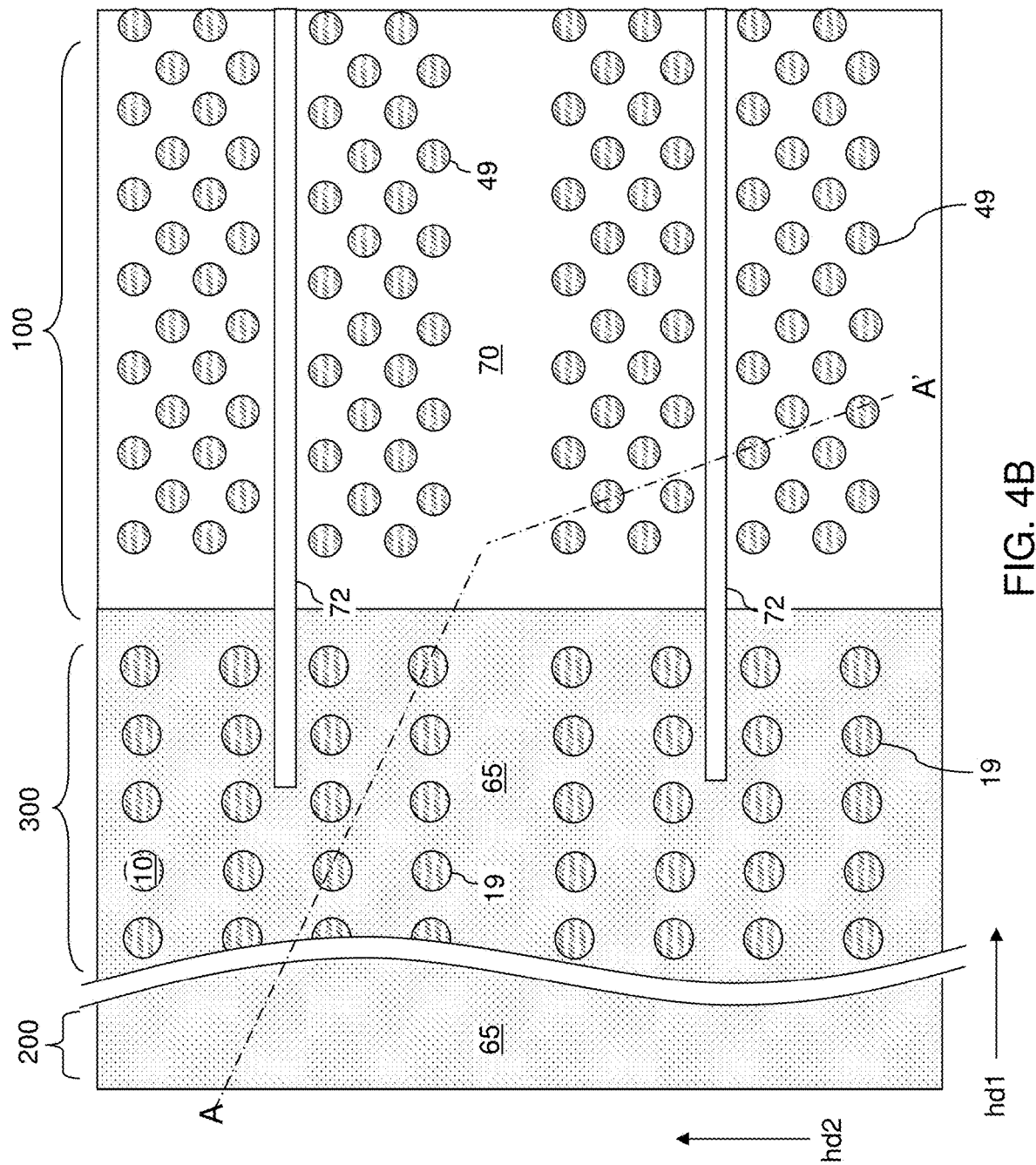
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the vertical sequence (32, 42A, 41, 42B) by at least one anisotropic etch that employs the patterned lithographic material stack as an etch mask. Portions of the vertical sequence (32, 42A, 41, 42B) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the vertical sequence (32, 42A, 41, 42B) in the memory array region 100. The support openings 19 are formed through the retro-stepped dielectric material portion 65 and the portion of the vertical sequence (32, 42A, 41, 42B) that underlie the stepped surfaces in the contact region 300.

The memory openings 49 extend through the entirety of the vertical sequence (32, 42A, 41, 42B). The support openings 19 extend through a subset of layers within the vertical sequence (32, 42A, 41, 42B). The chemistry of the anisotropic etch process employed to etch through the materials of the vertical sequence (32, 42A, 41, 42B) can alternate to optimize etching of the first and second materials in the vertical sequence (32, 42A, 41, 42B). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the vertical sequence (32, 42A, 41, 42B) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extended to a top surface of the substrate semiconductor layer 9.

FIGS. 5A-5J illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the first exemplary structure of FIGS. 4A and 4B is illustrated. The memory opening 49 extends through the insulating cap layer 70, the vertical sequence (32, 42A, 41, 42B), and optionally into an upper portion of the semiconductor material layer 10. At this processing step, each support opening 19 can extend through the retro-stepped dielectric material portion 65, a subset of layers in the vertical sequence (32, 42A, 41, 42B), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, lateral recesses (149A, 149B) are formed by performing an etch process that etches the materials of the first sacrificial material layers 42A and the second sacrificial material layers 42B selective to the materials of the insulating layers 32 and the spacer sacrificial material layers 41. For example, if the insulating layers 32 comprise undoped silicate glass or a doped silicate glass, if the spacer sacrificial material layers 41 comprise a semiconductor material, and if the first sacrificial material layers 42A and the second sacrificial material layers 42B comprise silicon nitride, the etch process can include an isotropic wet etch process employing hot phosphoric acid or a reactive ion etch (RIE) process. If the insulating layers 32 comprise undoped silicate glass or a doped silicate glass, if the spacer sacrificial material layers 41 comprise silicon nitride, and if the first sacrificial material layers 42A and the second sacrificial material layers 42B comprise a semiconductor material, the isotropic etch process can include a wet etch process employing hot trimethyl-2 hydroxyethyl ammonium hydroxide ("hot TMY") or tetramethyl ammonium hydroxide (TMAH). If the insulating layers 32 comprise undoped silicate glass or a doped silicate glass, if the spacer sacrificial material layers 41 comprise a non-porous silicon nitride, and if the first sacrificial material layers 42A and the second sacrificial material layers 42B comprise porous silicon nitride, the isotropic etch process can include a wet etch process employing dilute hydrofluoric acid (e.g., 100:1 water to HF ratio).

First lateral recesses 149A are formed in volumes from which surface portions of the first sacrificial material layers 42A are isotropically etched, and second lateral recesses 149B are formed in volumes from which surface portions of the second sacrificial material layers 42B are isotropically etched. In one embodiment, the first sacrificial material layers 42A and the second sacrificial material layers 42B comprise a same sacrificial material, and the first lateral recesses 149A and the second lateral recesses 149B may have a same lateral recess distance, i.e., lateral distance between a sidewall of a recessed first or second sacrificial material layer (42A, 42B) relative to a most proximate insulating layer 32. The lateral recess distance of the first lateral recesses 149A and the second lateral recesses 149B can be in a range from 5 nm to 50 nm, such as from 10 nm to 30 nm, although lesser and greater lateral recess distances can also be employed.

Generally, first lateral recesses 149A can be formed by laterally recessing each of the first sacrificial material layers 42A around each of the memory openings 49, and second lateral recesses 149B can be formed by laterally recessing each of the second sacrificial material layers 42B around each of the memory openings 49 concurrently with, prior to, or after, formation of the first lateral recesses 149A. In one embodiment, the first sacrificial material layers 42A and the second sacrificial material layers 42B comprise a same sacrificial material, and the first lateral recesses and the second lateral recesses are formed simultaneously in an isotropic etch process that laterally recesses the first sacrificial material layers and the second sacrificial material layers.

Referring to FIG. 5D, a blocking dielectric layer 52L and a memory material layer 54L may be conformally deposited over the physically exposed surfaces around the memory openings 49 and the support openings 19. The blocking dielectric layer 52 can include a single dielectric material layer or a stack of a plurality of dielectric material layers. In one embodiment, the blocking dielectric layer can include silicon oxide and/or a dielectric metal oxide layer consisting essentially of a dielectric metal oxide. As used herein, a dielectric metal oxide refers to a dielectric material that includes at least one metallic element and at least oxygen. The thickness of the blocking dielectric layer 52L can be in a range from 1.5 nm to 6 nm, although lesser and greater thicknesses may also be employed.

The memory material layer 54L can include any material that can be employed to store data bits. The memory material layer 54L can include a charge storage material such as silicon nitride, a floating gate material such as conductive metal, heavily doped polysilicon or conductive metallic alloy (e.g., metal silicide), or any other material that can encode at least one data bit in a portion thereof. In one embodiment, the memory material layer 54L includes a charge storage material, such as silicon nitride. The thickness of the memory material layer 54L can be selected such that the entire volume of each of the first lateral recesses 149A and the second lateral recesses 149B is filled with the combination of the blocking dielectric layer 52L and the memory material layer 54L.

Referring to FIG. 5E, and anisotropic etch process can be performed to remove portions of the blocking dielectric layer 52L and the memory material layer 54L from outside the volumes of the first lateral recesses 149A and the second lateral recesses 149B. Each remaining contiguous portion of the blocking dielectric layer 52L comprises a blocking dielectric liner 52. The blocking dielectric liners 52 include first blocking dielectric liners 52A located within a respective one of the first lateral recesses 149A, and second blocking dielectric liners 52B located within a respective one of the second lateral recesses 149B.

Each remaining contiguous portion of the memory material layer 54L comprises a memory material portion 54. The memory material portions 54 include first memory material portions 54A located on and embedded within (e.g., surrounded on three sides) a respective one of the first blocking dielectric liners 52A, and second memory material portions 54B located on and embedded within a respective one of the second blocking dielectric liners 52B. In one embodiment, a second memory material portion 54B is vertically spaced from and is electrically isolated from a first memory material portion 54A by at least one blocking dielectric material portion, which includes a bottom portion of a second blocking dielectric liner 52B and a top portion of a first blocking dielectric liner 52A.

Generally, a pair of a discrete first memory material portion 54A and a discrete second memory material portion 54B can be vertically spaced from each other by a spacer sacrificial material layer 41. The pair of the first memory material portion 54A and the second memory material portion 54B can be vertically spaced from each other by the at least one blocking dielectric material portion. In one embodiment, the at least one dielectric material portion comprises a first blocking dielectric liner 52A contacting a top surface, a bottom surface, and an outer sidewalls of the first memory material portion 54A and contacting a spacer sacrificial material layer 41, and a second blocking dielectric liner 52B contacting a top surface, a bottom surface, and an outer sidewall of the second memory material portion 54B and contacting a top surface of the spacer sacrificial material layer 41. In one embodiment, the first blocking dielectric liner 52A and the second blocking dielectric liner 52B have a same uniform thickness and a same material composition throughout. In one embodiment, the first memory material portion 54A and the second memory material portion 54B have a same lateral thickness (between an inner sidewall and an outer sidewall) and a same material composition. In one embodiment, the second memory material portions 54B and the first memory material portions 54A can be formed concurrently.

Referring to FIG. 5F, a tunneling dielectric layer 56 and a sacrificial cover layer 601 can be conformally deposited in each of the memory openings 49 and the support openings 19 and over the insulating cap layer 70. The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The sacrificial cover layer 601 includes a material that can be employed to protect the tunneling dielectric layer 56 during a subsequent anisotropic etch process. For example, the sacrificial cover layer 601 can include a semiconductor material such as amorphous silicon or polysilicon, a carbon-based material such as amorphous carbon or diamond-like carbon, or a dielectric material that is different from the dielectric material of the tunneling dielectric layer 56.

An anisotropic etch process can be performed to remove horizontal portions of the sacrificial cover layer 601. A center portion of each pedestal channel portion 11 may be vertically recessed by the anisotropic etch process. The sacrificial cover layer 601 can be subsequently removed selective to the tunneling dielectric layer 56 by an isotropic etch process, which may comprise a wet etch process. Each contiguous set of first blocking dielectric liners 52A, second blocking dielectric liners 52B, first memory material portions 54A, second memory material portions 54B, and a tunneling dielectric layer 56 constitutes a memory film 50. In one embodiment, each neighboring pair of a first memory material portion 54A and a second memory material portion 54B spaced by a respective spacer sacrificial material layer 41 constitutes a multi-bit charge storage element, which includes a first charge storage element embodied as a first memory material portion 54A and a second memory material portion 54B.

Figure 5G:
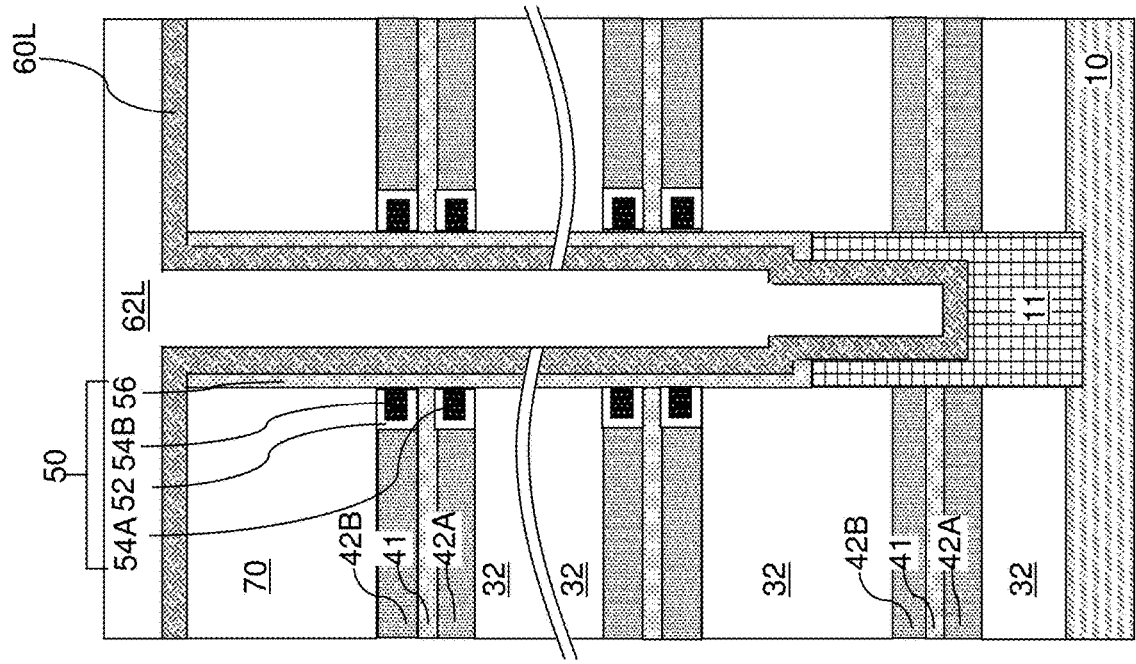

Referring to FIG. 5G, a semiconductor channel layer 60L can be deposited directly on the semiconductor surface of the pedestal channel portion 11 (or the semiconductor material layer 10 if the pedestal channel portion 11 is omitted), and directly on the tunneling dielectric layer 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Figure 5H:
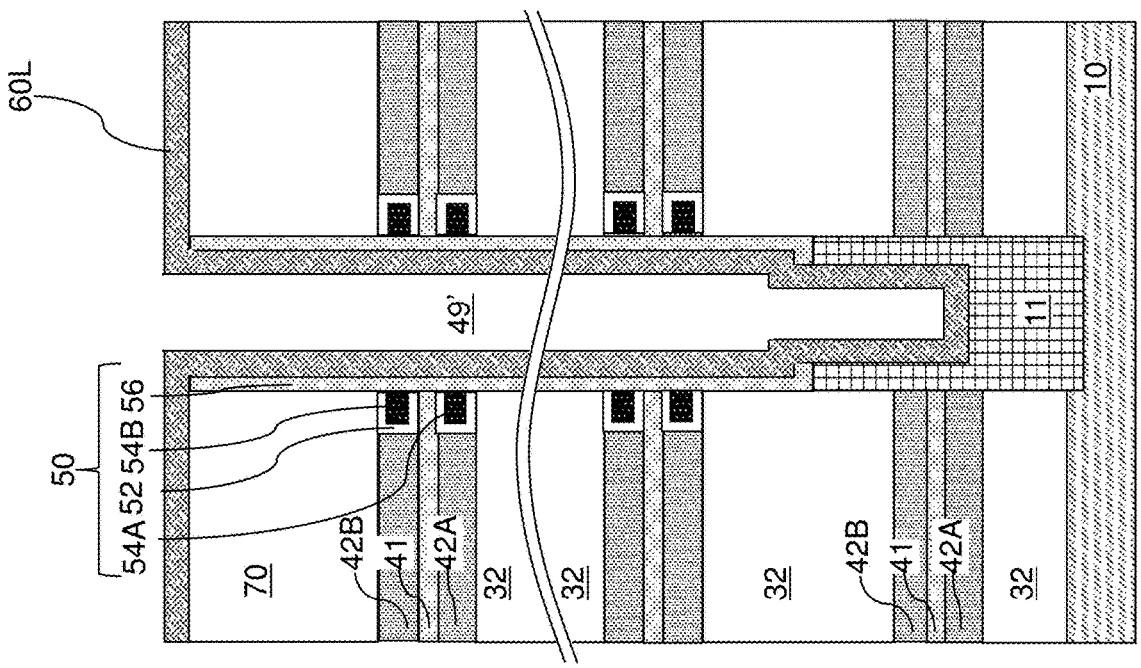

Referring to FIG. 5H, in case the memory cavity 49' in each memory opening 49 is not completely filled by the semiconductor channel layer 60L, a dielectric core layer 62L can be deposited in the memory cavity 49' to fill any remaining portion of the memory cavity 49' within each memory opening 49. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5I, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 5J, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each memory film 50 can store electrical charges with a macroscopic retention time. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the memory material layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
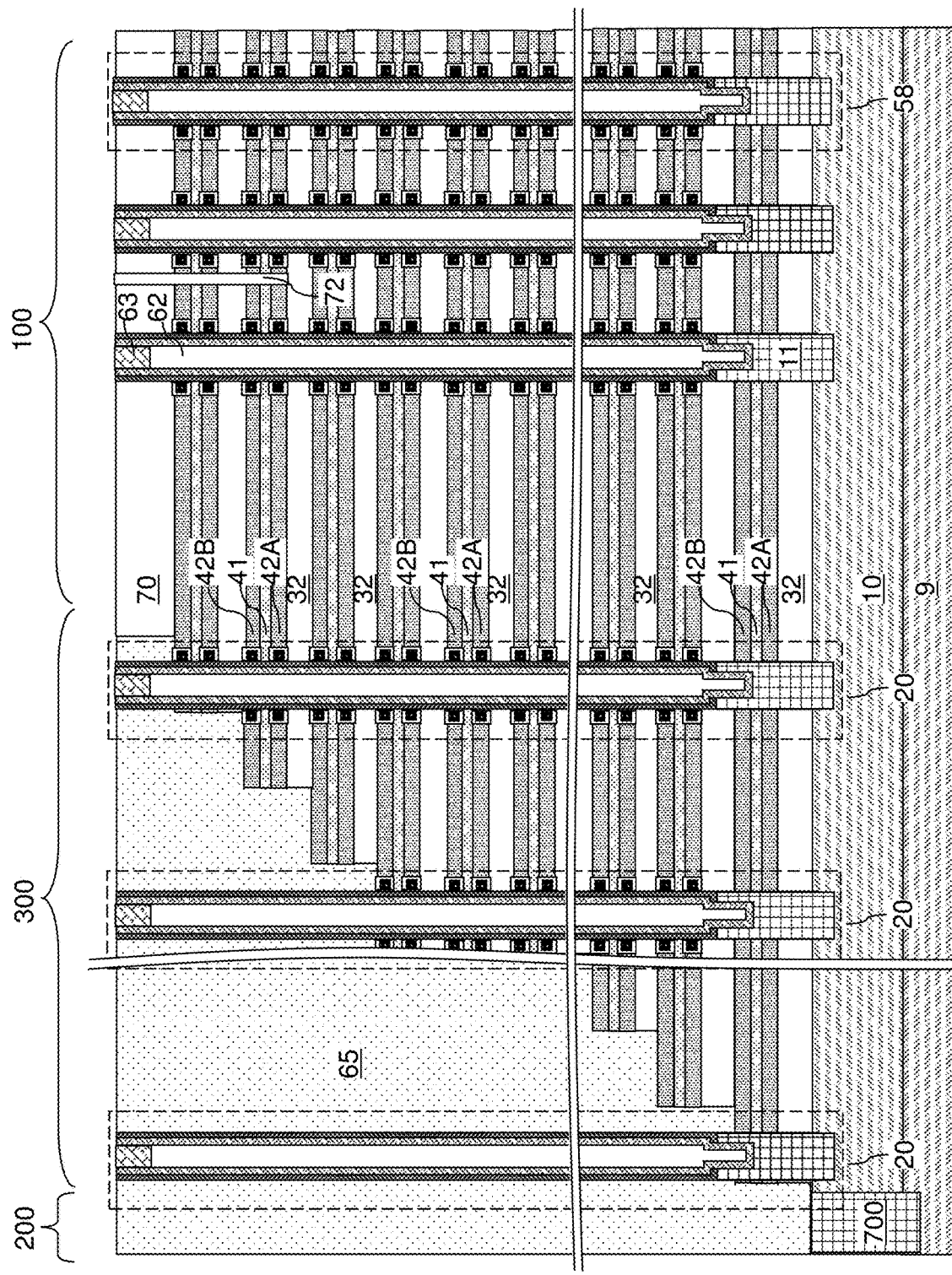
FIG. 6 is a schematic vertical cross-sectional view of the first exemplary structure after formation of memory stack structures and support pillar structures according to the first embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Figure 7A:
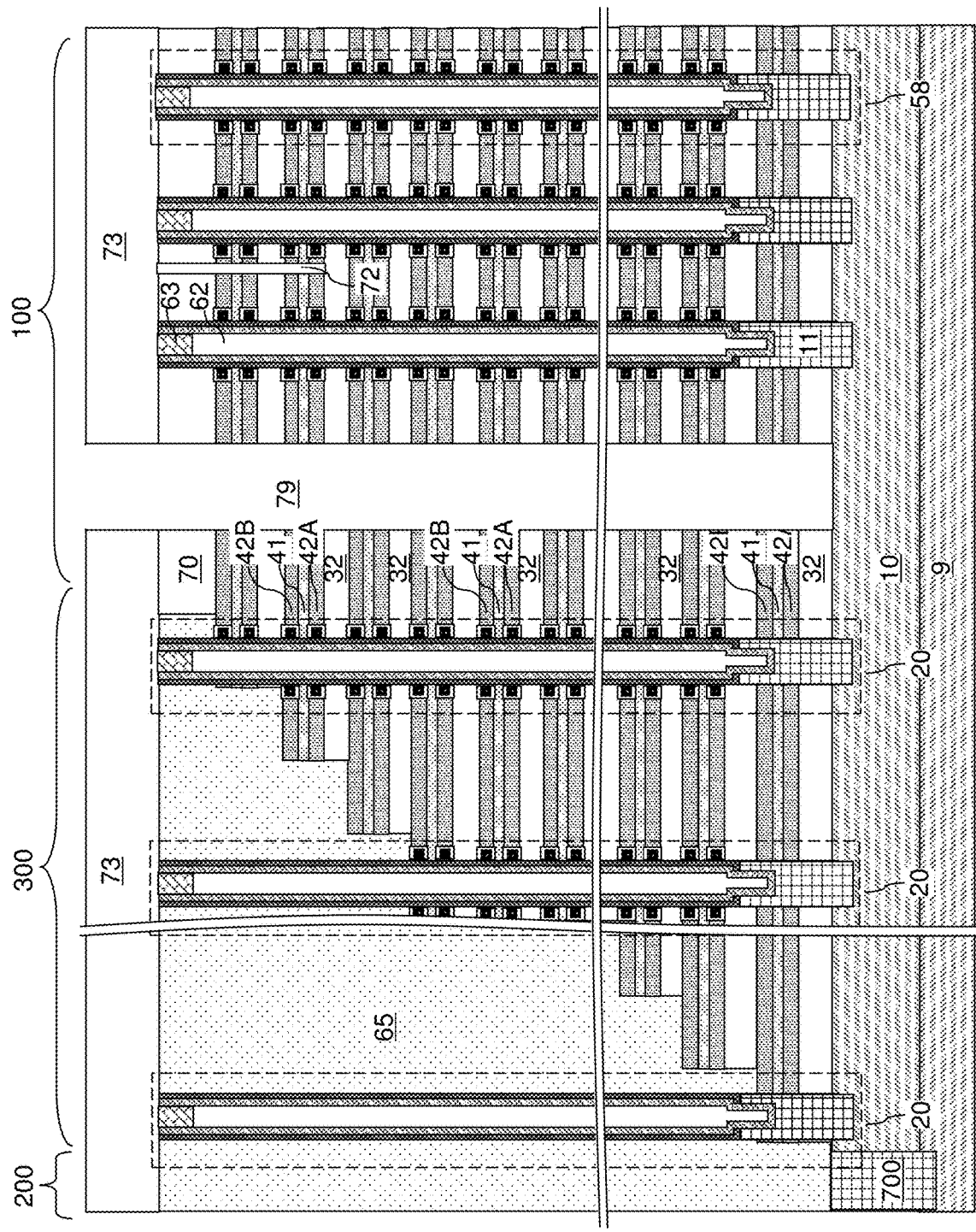
FIG. 7A is a schematic vertical cross-sectional view of the first exemplary structure after formation of backside trenches according to the first embodiment of the present disclosure.
Figure 7B:
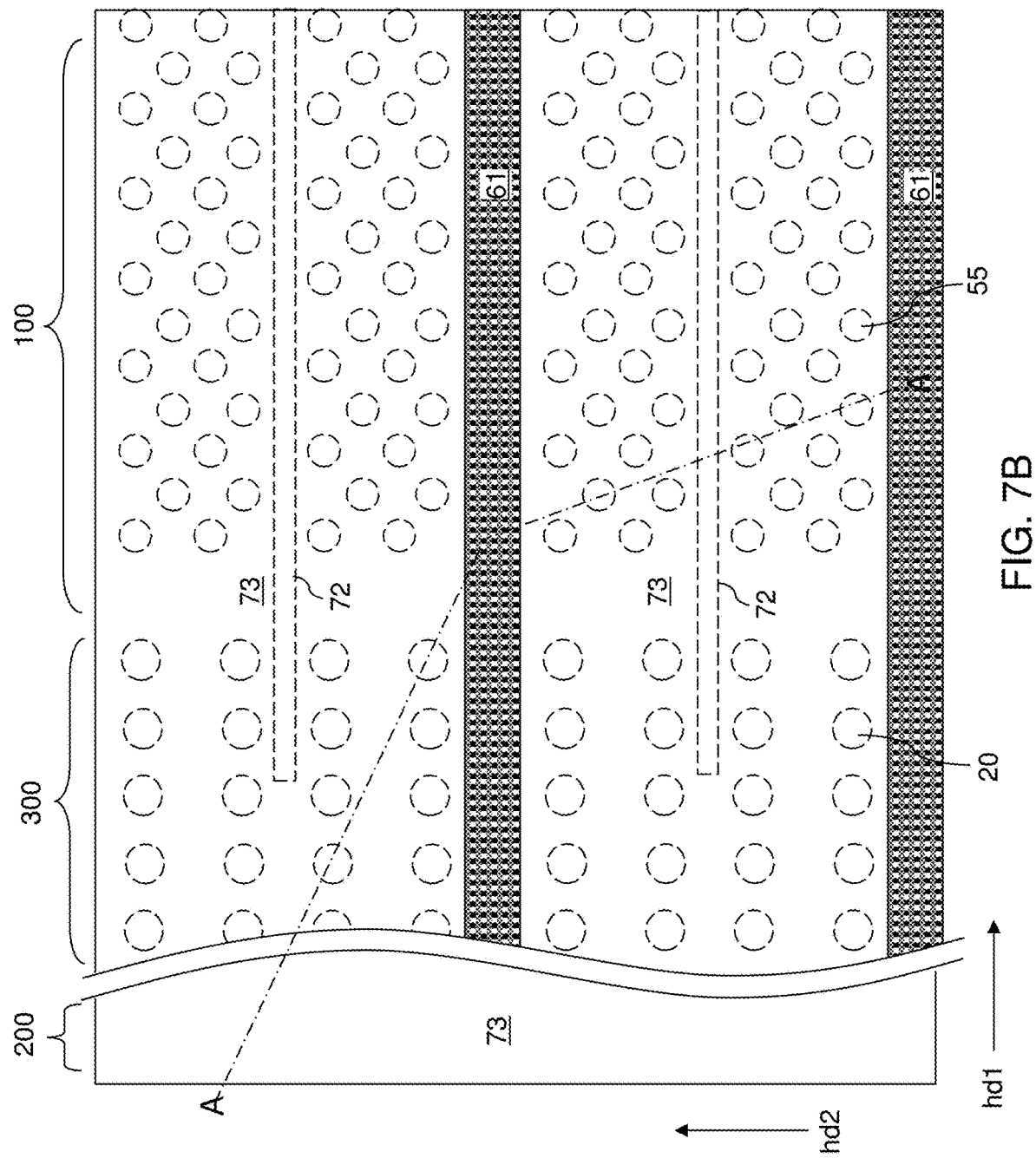
FIG. 7B is a partial see-through top-down view of the first exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the vertical sequence (32, 42A, 41, 42B) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the vertical sequence (32, 42A, 41, 42B) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction (e.g., bit line direction) hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Dopants of the second conductivity type can be implanted into physically exposed surface portions of the substrate (9, 10) (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the substrate (9, 10) that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. Each horizontal semiconductor channel 59 contacts a source region 61 and a plurality of pedestal channel portions 11.

Figure 8:
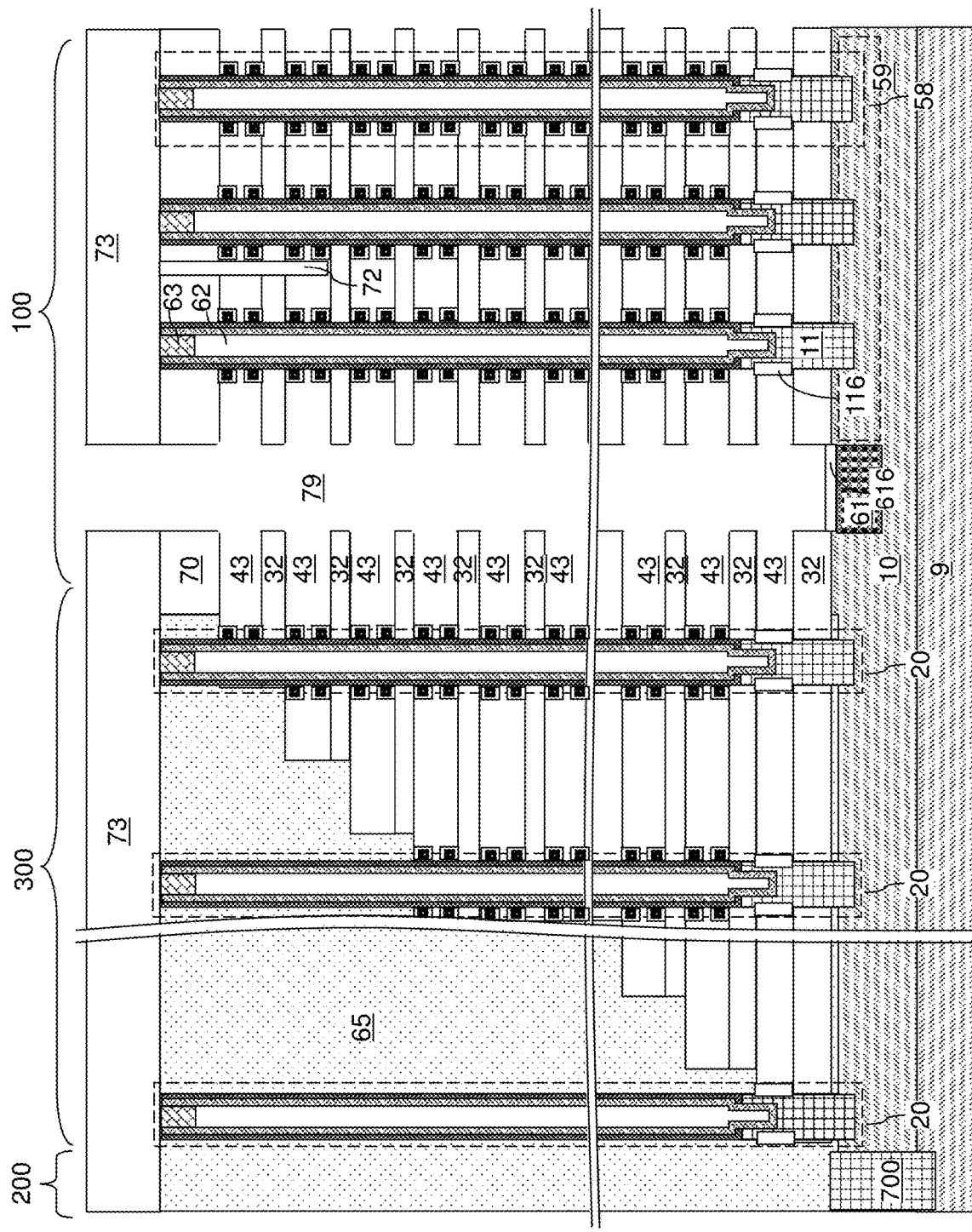
FIG. 8 is a schematic vertical cross-sectional view of the first exemplary structure after formation of backside recesses according to the first embodiment of the present disclosure.
Figure 9A:
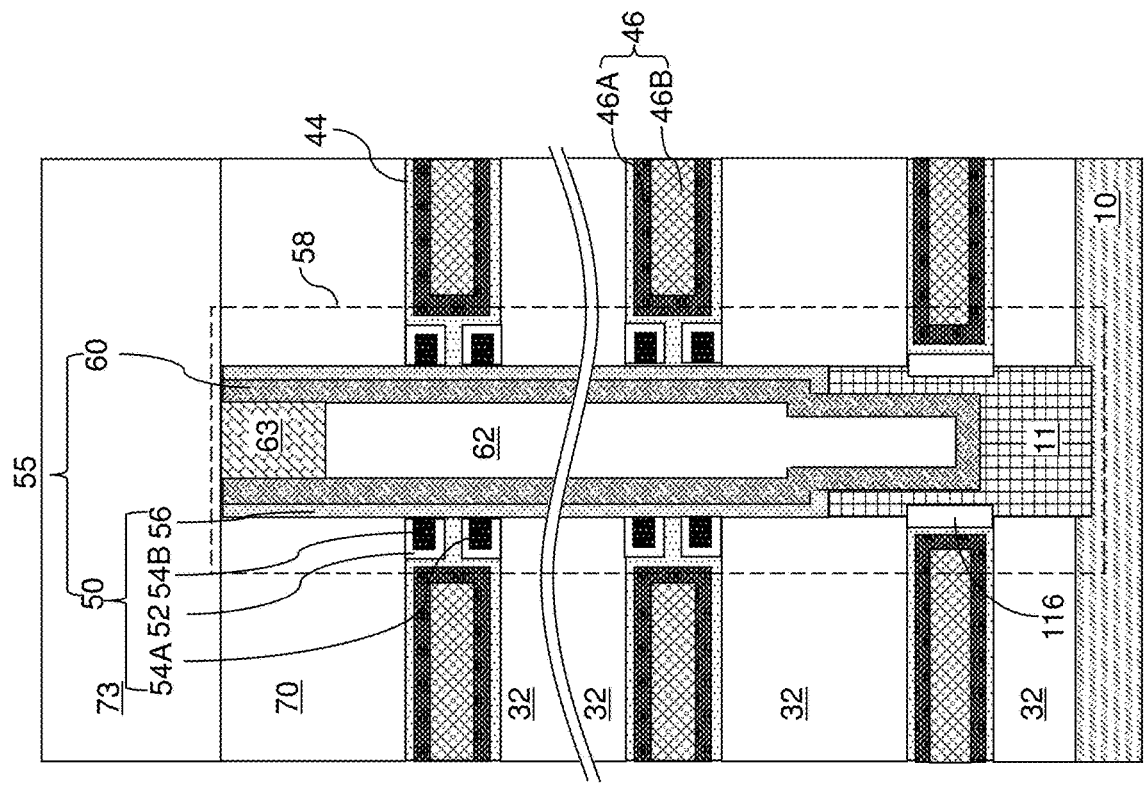
FIGS. 9A and 9B are sequential vertical cross-sectional views of a region around a memory opening fill structure of the first exemplary structure during formation of electrically conductive layers according to the first embodiment of the present disclosure.

Referring to FIGS. 8 and 9A, at least one isotropic selective etch process can be performed to etch the materials of the first sacrificial material layers 42A, the second sacrificial material layers 42B, and the spacer sacrificial material layers 41 with respect to the materials of the insulating layers 32 and the semiconductor material layer 10. In one embodiment, the first sacrificial material layers 42A, the second sacrificial material layers 42B, and the spacer sacrificial material layers 41 can be removed employing two selective isotropic etch processes that remove the material of the first and second sacrificial material layers (42A, 42B) prior to, or after, removal of the material of the spacer sacrificial material layers 41. Alternatively, a single selective isotropic etch process can be employed to remove the materials of the first and second sacrificial material layers (42A, 42B) and the spacer sacrificial material layers 41 simultaneously.

Backside recesses 43 are formed in volumes from which the sacrificial material layers (42A, 42B, 41) are removed.

The removal of the second material of the sacrificial material layers (42A, 42B, 41) can be selective to the first material of the insulating layers 32, the material of the retro-stepped dielectric material portion 65, the semiconductor material of the semiconductor material layer 10, and the material of the outermost layer of the memory films 50. Each of the backside recesses 43 includes a volume of one of the first sacrificial material layers 42A, one of the second sacrificial material layers 42B, and one of the spacer sacrificial material layers 41.

A plurality of backside recesses 43 can be formed in the volumes from which the sacrificial material layers (42A, 42B, 41) are removed. The memory openings 49 in which the memory stack structures 55 are formed are herein referred to as front side openings or front side cavities in contrast with the backside recesses 43. In one embodiment, the memory array region 100 comprises an array of three-dimensional memory strings having a plurality of device levels disposed above the substrate (9, 10). In this case, each backside recess 43 can define a space for receiving a respective word line. Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 9B:
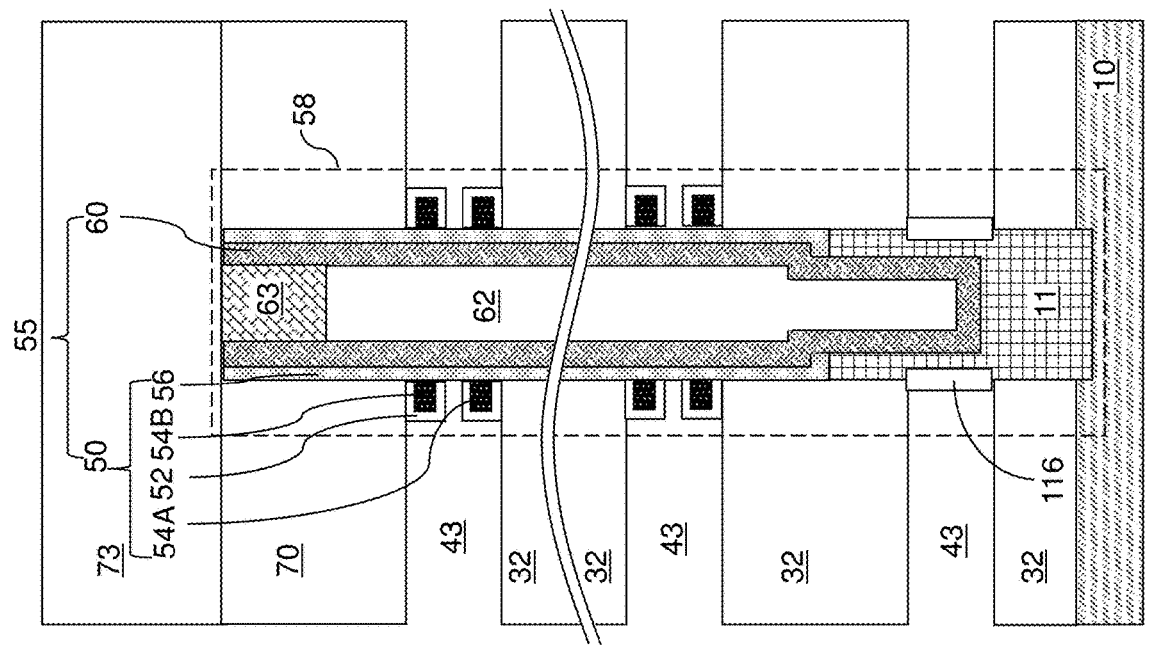
Figure 10:
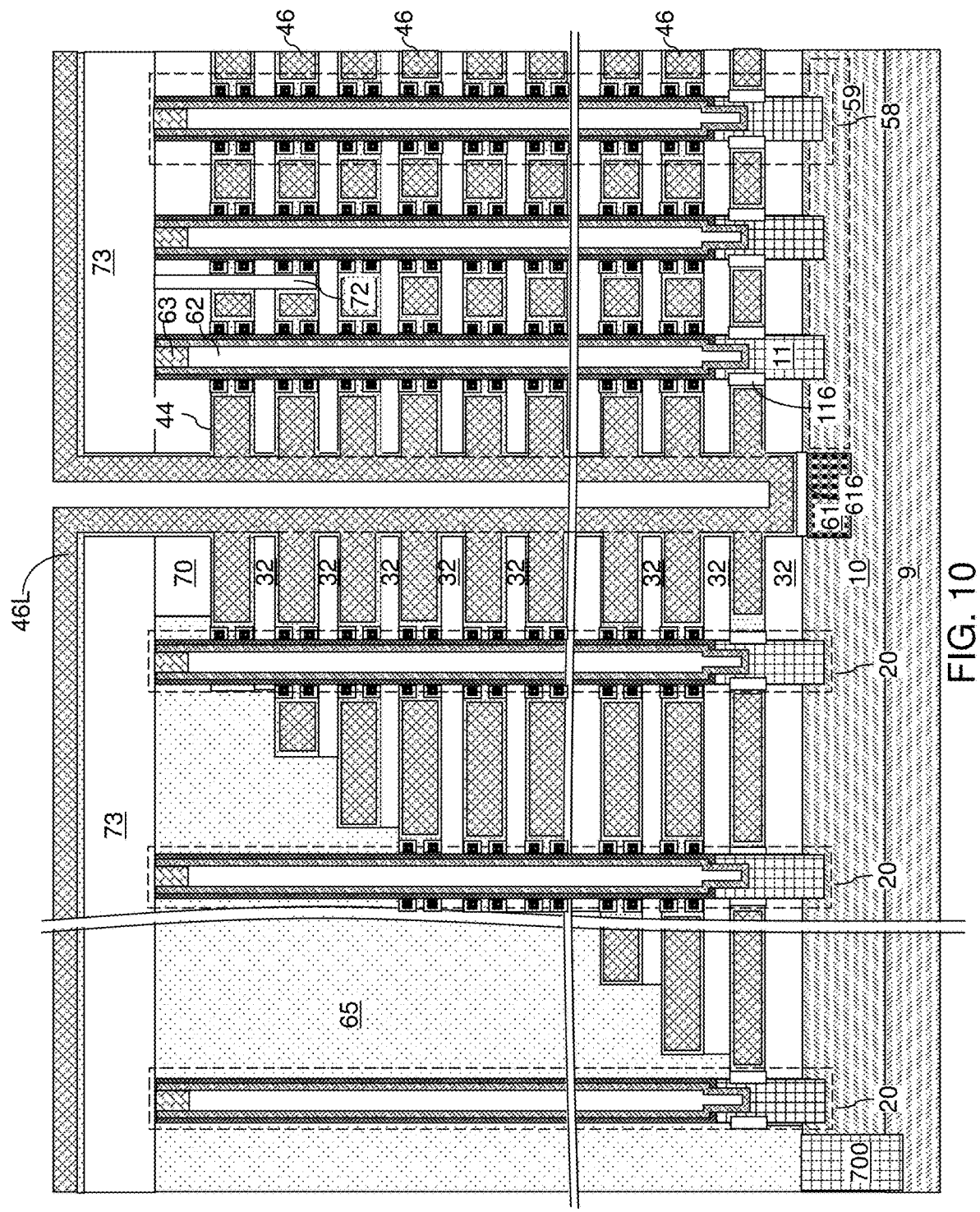
FIG. 10 is a schematic vertical cross-sectional view of the first exemplary structure at the processing step of FIG. 9D.

Referring to FIGS. 9B and 10, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

The backside blocking dielectric layer 44 can be formed directly on each outside sidewall of the first blocking dielectric liners 52A, on each annular top surface of the first blocking dielectric liners 52A, on each outer sidewall of the second blocking dielectric liners 52B, and on each annular bottom surface of the second blocking dielectric liners 52B. Further, the blocking dielectric liner 44 can be formed on cylindrical segments of the outer sidewall of the tunneling dielectric layer 56 at each level of the backside recesses 43. The blocking dielectric liner 44 can fill the gap between each vertically neighboring pair of a first blocking dielectric liner 52A and a second blocking dielectric liner 52B and is thus located between each pair of discrete vertically separated first and second memory material portions (54A, 54B).

A metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each contiguous combination of a first sacrificial material layer 42A, a spacer sacrificial material layer 41, and a second sacrificial material layer 42B can be replaced with a respective portion of the backside blocking dielectric layer 44 and a respective electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Generally, each of the electrically conductive layers 46 is formed within a remaining volume of a respective one of the backside recesses 43 on a respective portion of the backside blocking dielectric layer 44. The first sacrificial material layers 42A, the second sacrificial material layers 42B, and the spacer sacrificial material layers 41 are replaced with the electrically conductive layers 46. At least one blocking material portion is provided within each vertically neighboring pair of a first memory material portion 54A and a second memory material portion 54B located between a vertically neighboring pair of insulating layers 32. The at least one blocking dielectric material portion comprises a laterally protruding portion of a backside blocking dielectric layer 44 that is in direct contact with one of the electrically conductive layers 46.

In one embodiment, the backside blocking dielectric layer 44 can comprise a first horizontally-extending portion that contacts a top surface of one of the electrically conductive layers 46, a second horizontally-extending portion that contacts a bottom surface of the one of the electrically conductive layers 46, and a plurality of vertically extending portions (i.e., cylindrical portions) that connect the first horizontally-extending portion and the second horizontally extending portion and laterally surrounding a respective one of the memory opening fill structures 58. A laterally protruding portion of the backside blocking dielectric layer 44 is adjoined to a middle section of one of the plurality of vertically extending portions of the backside blocking dielectric layer 44. Each laterally-protruding portion of the backside blocking dielectric layer 44 can have an annular shape, and can contact a top surface of an underlying first blocking dielectric liner 52A and a bottom surface of an overlying second blocking dielectric liner 52B. In one embodiment, each of the plurality of vertically extending portions of the backside blocking dielectric layer 44 laterally surrounds a respective one of the memory stack structures 55 and has a respective cylindrical configuration, and the laterally protruding portion contacts a cylindrical segment of an outer sidewall of the tunneling dielectric layer 56 located within a respective one of the memory openings 49.

Each vertically neighboring pair of a first memory material portion 54A and a second memory material portion 54B located at a level of an electrically conductive layer 46 can be vertically spaced from each other by the at least one blocking dielectric material portion. In one embodiment, the dielectric material portion comprises a first blocking dielectric liner 52A contacting a top surface, a bottom surface, and an outer sidewalls of a first memory material portion 54A and contacting a bottom surface of the laterally protruding portion of the backside blocking dielectric layer 44, and a second blocking dielectric liner 52B contacting a top surface, a bottom surface, and an outer sidewall of the second memory material portion 54B and contacting a top surface of the laterally protruding portion of the backside blocking dielectric layer 44. Thus, two discrete, vertically separated memory material portions (54A, 54B) are located in each memory stack structure 55 adjacent to a vertical sidewall of each electrically conductive layer (e.g., control gate electrode/word line) 46, such that each electrically conductive layer (e.g., control gate electrode/word line) 46 controls plural (e.g., two) memory material portions (54A, 54B) in each memory stack structure 55. Each memory material portion (54A, 54B) can store one bit of data. Thus, plural (e.g., two) bits of data can be stored adjacent to each vertical sidewall of each electrically conductive layer (e.g., control gate electrode/word line) 46.

In one embodiment, the at least one blocking dielectric material portion comprises a first blocking dielectric liner 54 contacting a top surface, a bottom surface, and an outer sidewalls of the first memory material portion 54A, and a second blocking dielectric liner contacting a top surface, a bottom surface, and an outer sidewall of the second memory material portion 54B. In one embodiment, the first blocking dielectric liner 52A comprises a top annular portion overlying the first memory material portion 54A and contacting the tunneling dielectric layer 56, a bottom annular portion underlying the first memory material portion 54A and contacting the tunneling dielectric layer 56, and a cylindrical portion connecting the top annular portion and the bottom annular portion of the first blocking dielectric liner 52A; and the second blocking dielectric liner 52B comprises a top annular portion overlying the second memory material portion 54B and contacting the tunneling dielectric layer 56, a bottom annular portion underlying the second memory material portion 54B and contacting the tunneling dielectric layer, and a cylindrical portion connecting the top annular portion and the bottom annular portion of the second blocking dielectric liner.

In one embodiment, the first blocking dielectric liner 52A and the second blocking dielectric liner 52B have a same uniform thickness and a same material composition throughout. In one embodiment, the first memory material portion 54A and the second memory material portion 54B have a same lateral thickness and a same material composition.

Figure 11A:
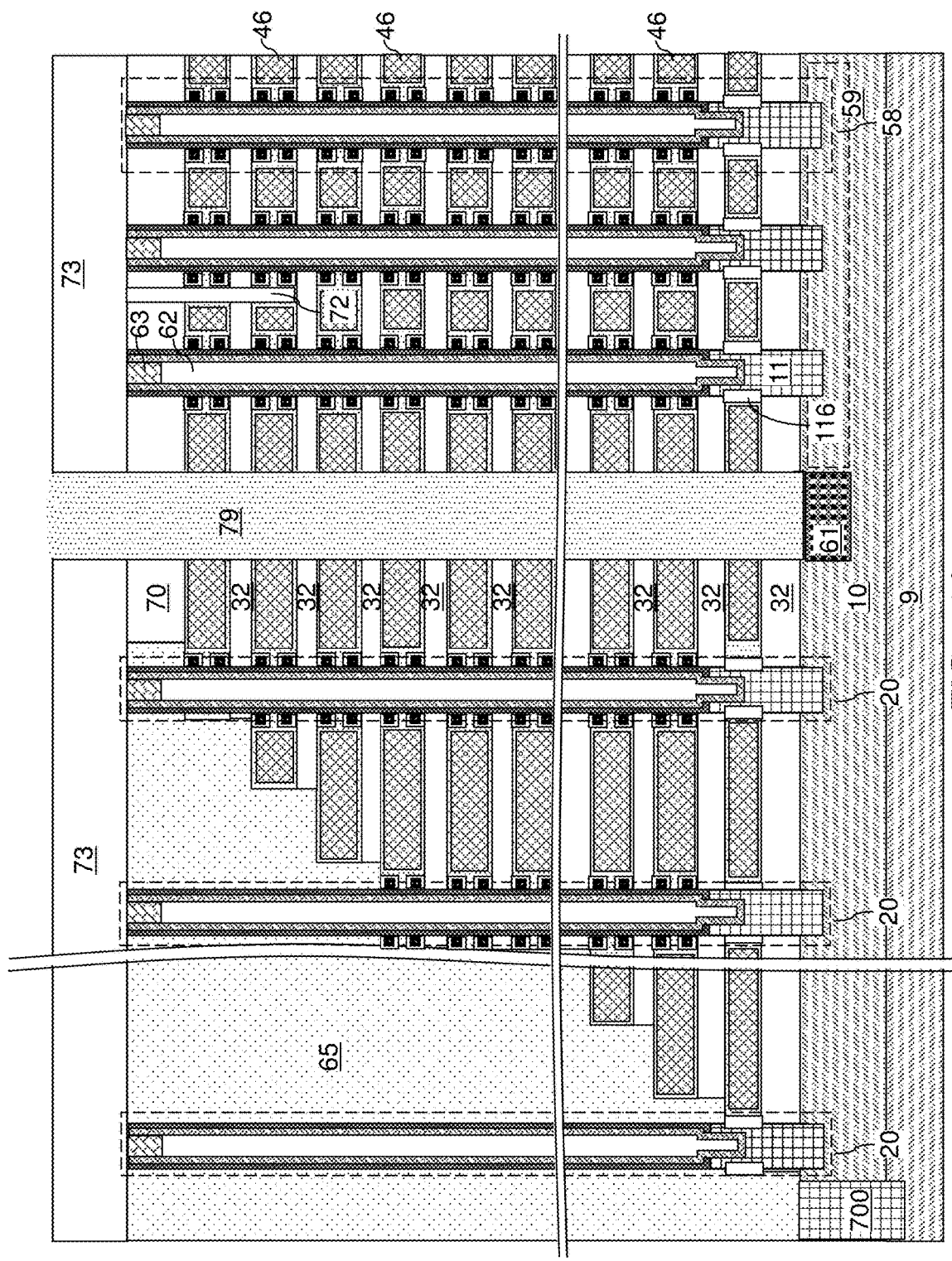
FIG. 11A is a schematic vertical cross-sectional view of the first exemplary structure after removal of a deposited conductive material from within the backside trench according to the first embodiment of the present disclosure.
Figure 11B:
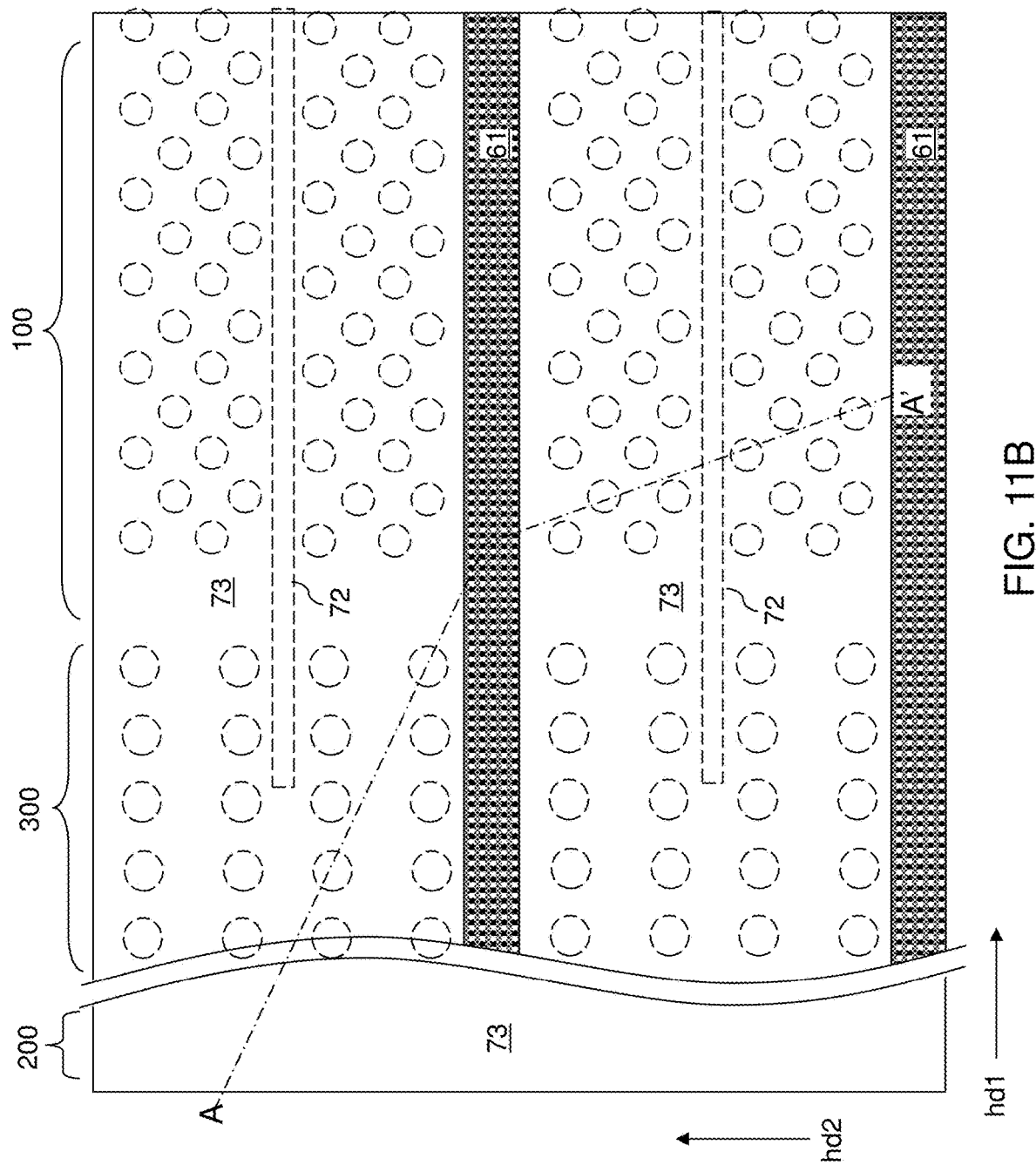
FIG. 11B is a top-down view of the first exemplary structure of FIG. 11A. The vertical plane A-A' is the plane of the schematic vertical cross-sectional view of FIG. 11A.
Figure 12A:
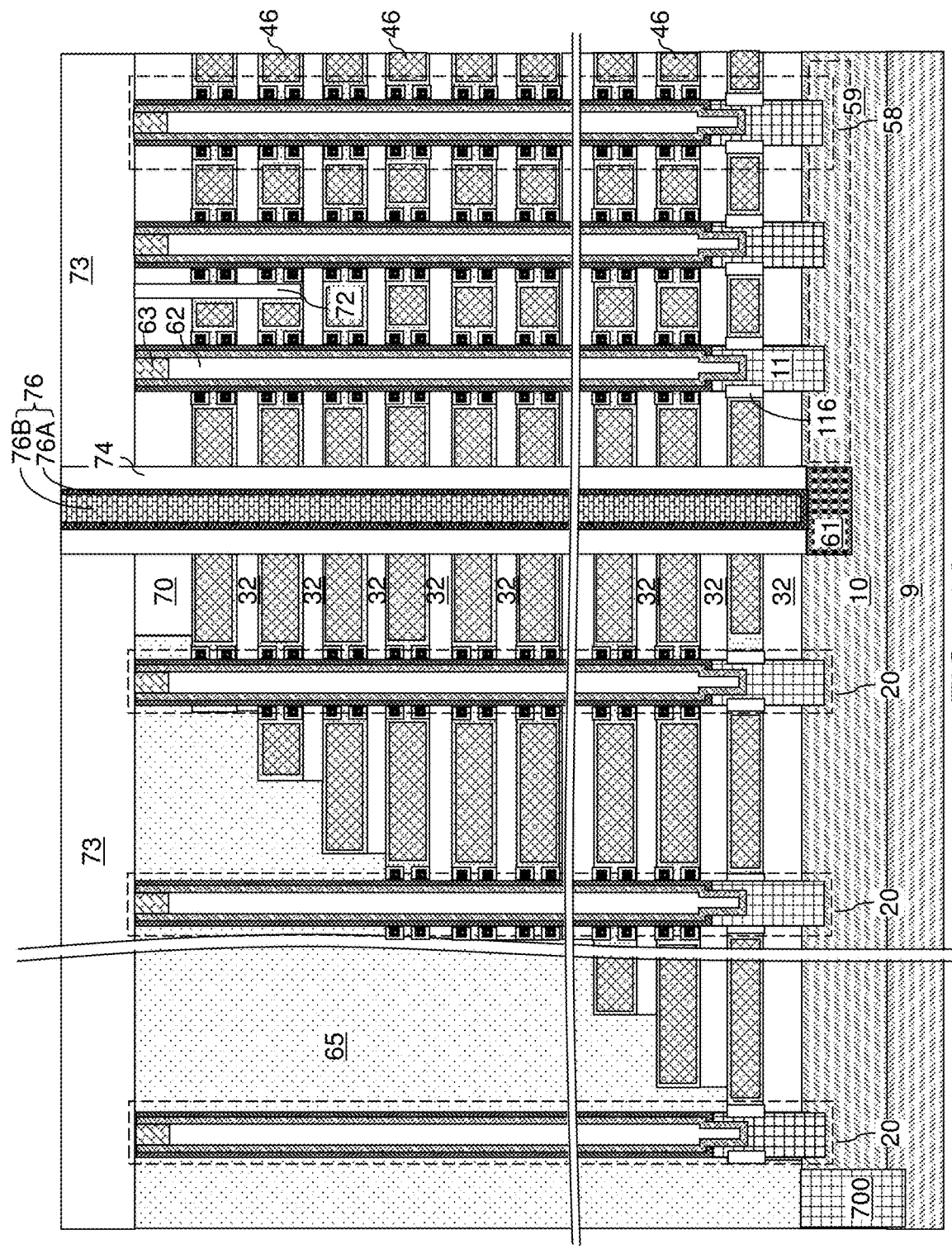
FIG. 12A is a schematic vertical cross-sectional view of the first exemplary structure after formation of an insulating spacer and a backside contact structure in each backside trench according to the first embodiment of the present disclosure.
Figure 12B:
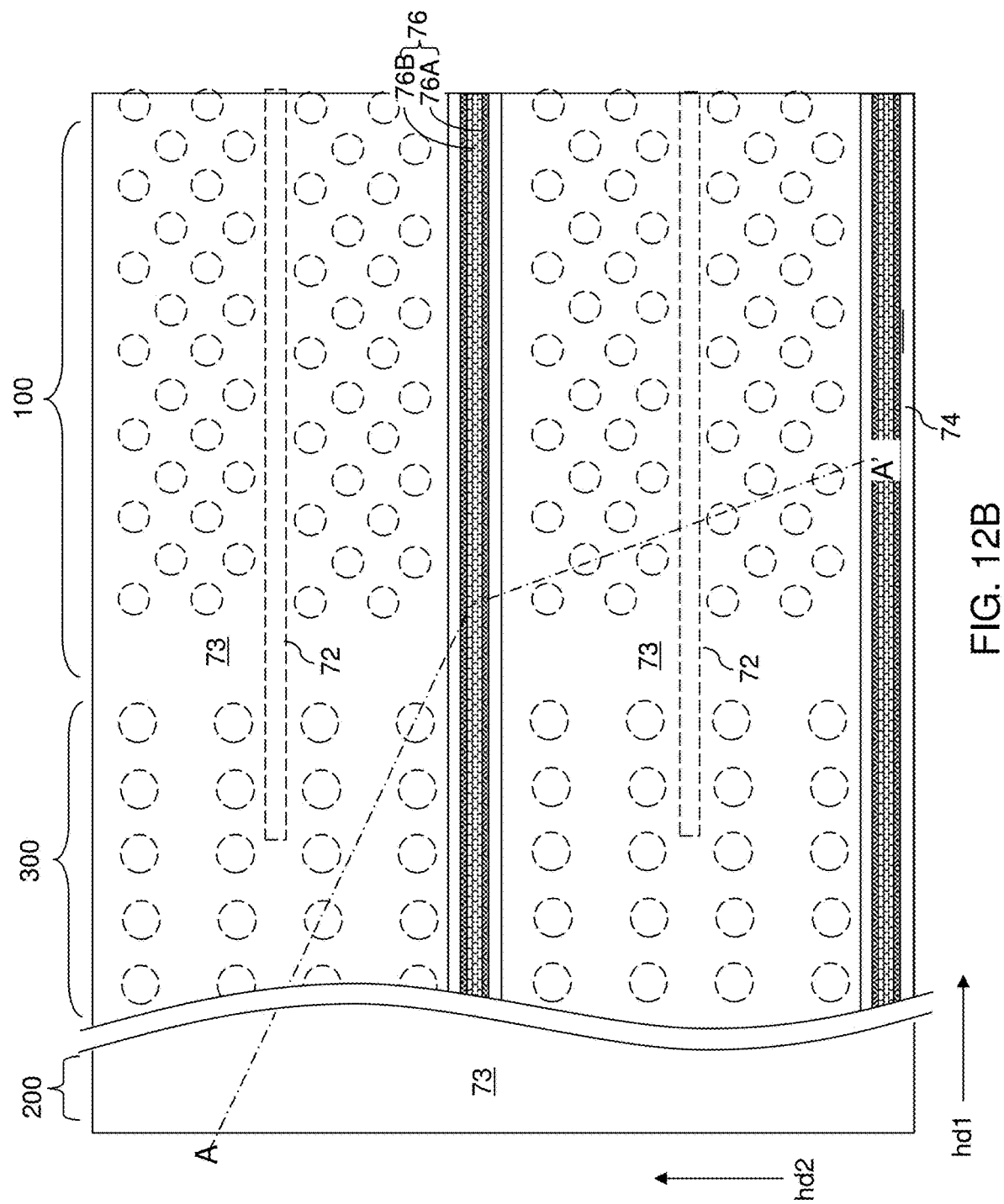
FIG. 12B is a magnified view of a region of the first exemplary structure of FIG. 12A.

Referring to FIGS. 11A and 11B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

An insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present within the backside trenches 79, the insulating material layer can be formed directly on surfaces of the backside blocking dielectric layer 44 and directly on the sidewalls of the electrically conductive layers 46. If a backside blocking dielectric layer 44 is not present within the backside trenches 79, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74.

A top surface of a source region 61 can be physically exposed at the bottom of each backside trench 79. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. Each backside contact via structure 76 extends through the alternating stacks (32, 46), and contacts a top surface of a respective source region 61. If a backside blocking dielectric layer 44 is employed, each backside contact via structure 76 can contact a sidewall of the backside blocking dielectric layer 44.

Generally, a backside contact via structure 76 can be formed within each of the backside trenches 79 after formation of the insulating spacers 74 by depositing and planarizing at least one conductive material in volumes of the backside trenches 79 that are not filled with the insulating spacers 74. Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact any side of the lower portion of the semiconductor channel 60.

Figure 13A:
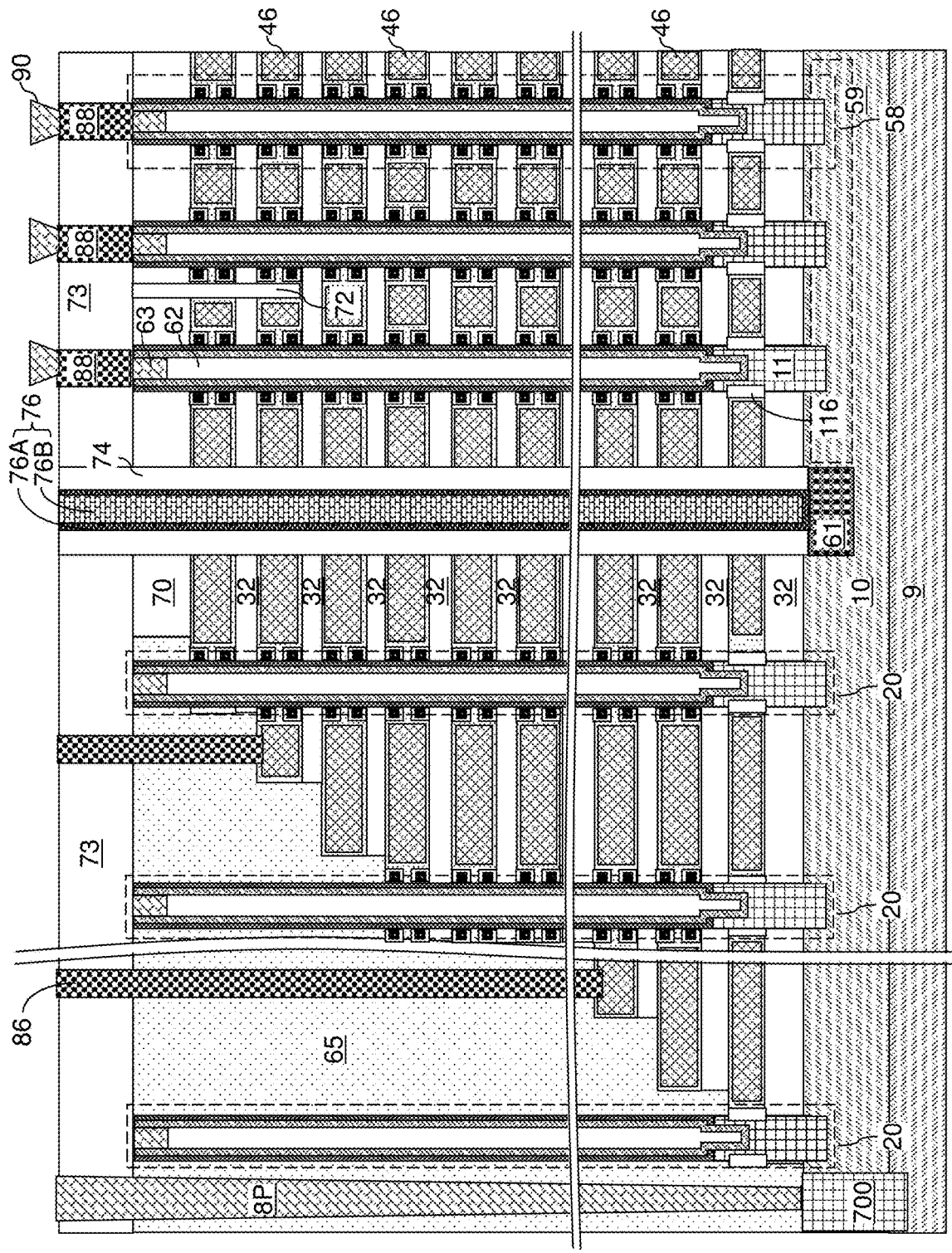
FIG. 13A is a schematic vertical cross-sectional view of the first exemplary structure after formation of additional contact via structures according to the first embodiment of the present disclosure.
Figure 13B:
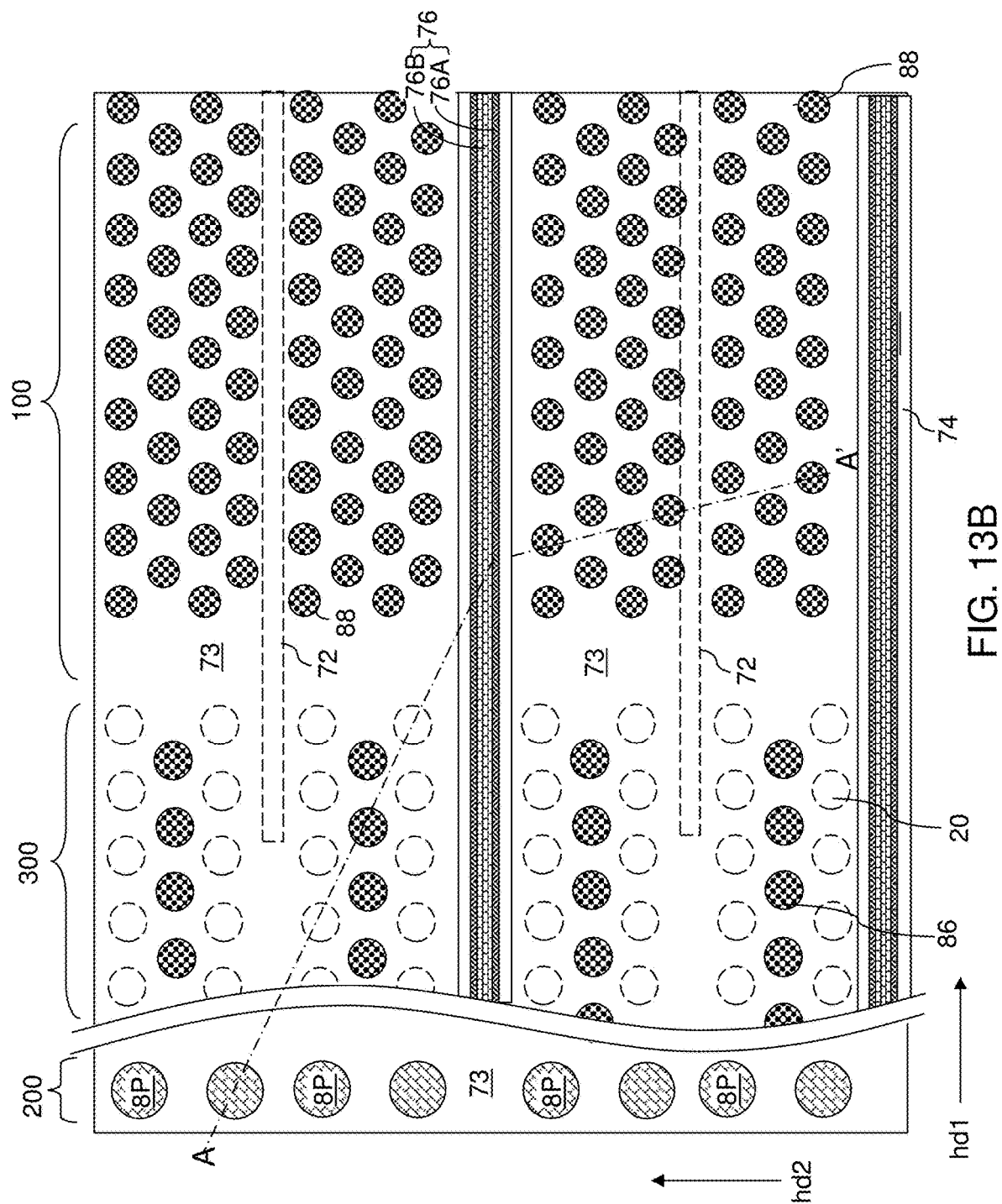
FIG. 13B is a top-down view of the first exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices. Bit lines 90 which extend in the second horizontal direction hd2 are then formed in electrical contact with the drain contact via structures 88 over the contact-level dielectric layer 73.

Figure 14:
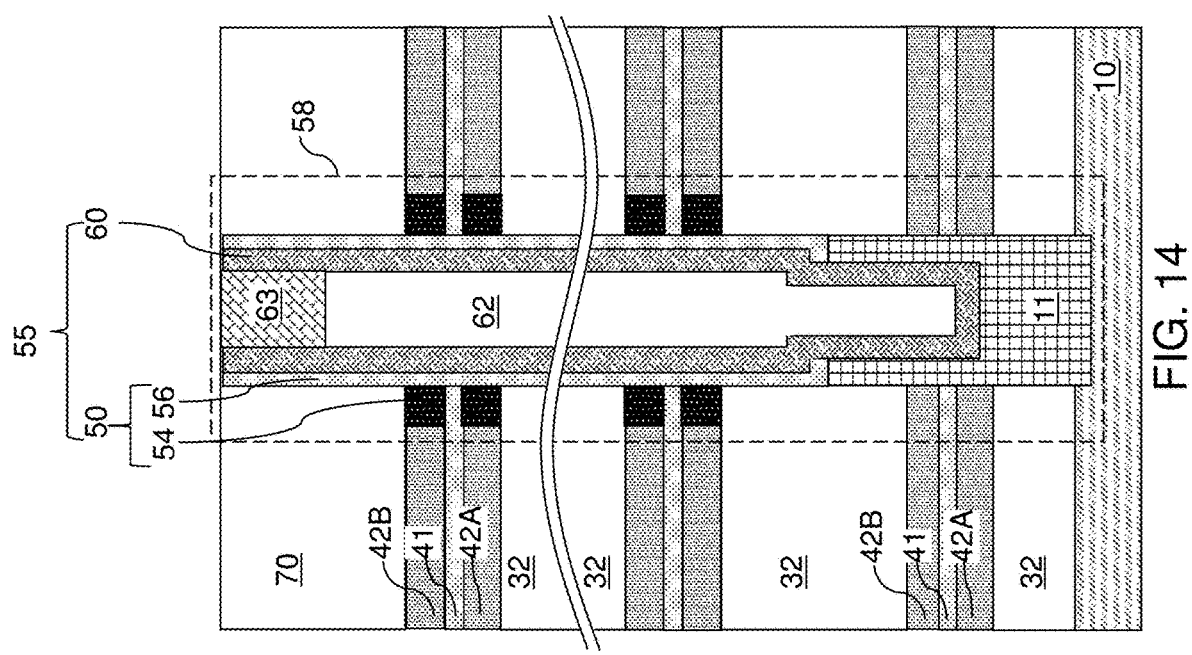
FIG. 14 illustrates a memory opening fill structure according to an alternative embodiment of the first exemplary structure at the processing step of FIG. 5J.

Referring to FIG. 14, a memory opening fill structure 58 according to an alternative embodiment of the first exemplary structure is illustrated at the processing step of FIG. 5J. The alternative embodiment of the first exemplary structure can be derived from the first exemplary structure by omitting formation of the blocking dielectric layer 52L at the processing steps of FIG. 5D. Thus, the first blocking dielectric liners 52A and the second blocking dielectric liners 52B are absent in the alternative embodiment of the first exemplary structure.

Referring to FIG. 15A, the processing steps of FIGS. 7A-9A can be performed. In this case, removal of the sacrificial material layers (42A, 42B, 41) can be selective to the material of the memory material portions (54A, 54B). The memory material portions (54A, 54B) can be physically exposed to the backside recesses 43. Thus, the memory material portions (54A, 54B) may comprise a material other than silicon nitride (e.g., a conductive floating gate, etc.) if the sacrificial material layers (42A, 42B and/or 41) comprise silicon nitride. Alternatively, the memory material portions (54A, 54B) may comprise a silicon nitride charge storage material if the sacrificial material layers (42A, 42B, 41) comprise a material other than silicon nitride and/or comprise a more porous silicon nitride with a higher etch rate than the silicon nitride material of the memory material portions (54A, 54B).

Referring to FIG. 15B, the processing steps of FIGS. 9B, 10, 11A, and 11B can be performed to form a backside blocking dielectric layer 44 and electrically conductive layers 46.

Subsequently, the processing steps of FIGS. 12A-13B can be performed to provide an alternative embodiment of the first exemplary structure of FIGS. 13A and 13B, in which the first blocking dielectric liners 52A and the second blocking dielectric liners 52B are omitted.

Figure 16:
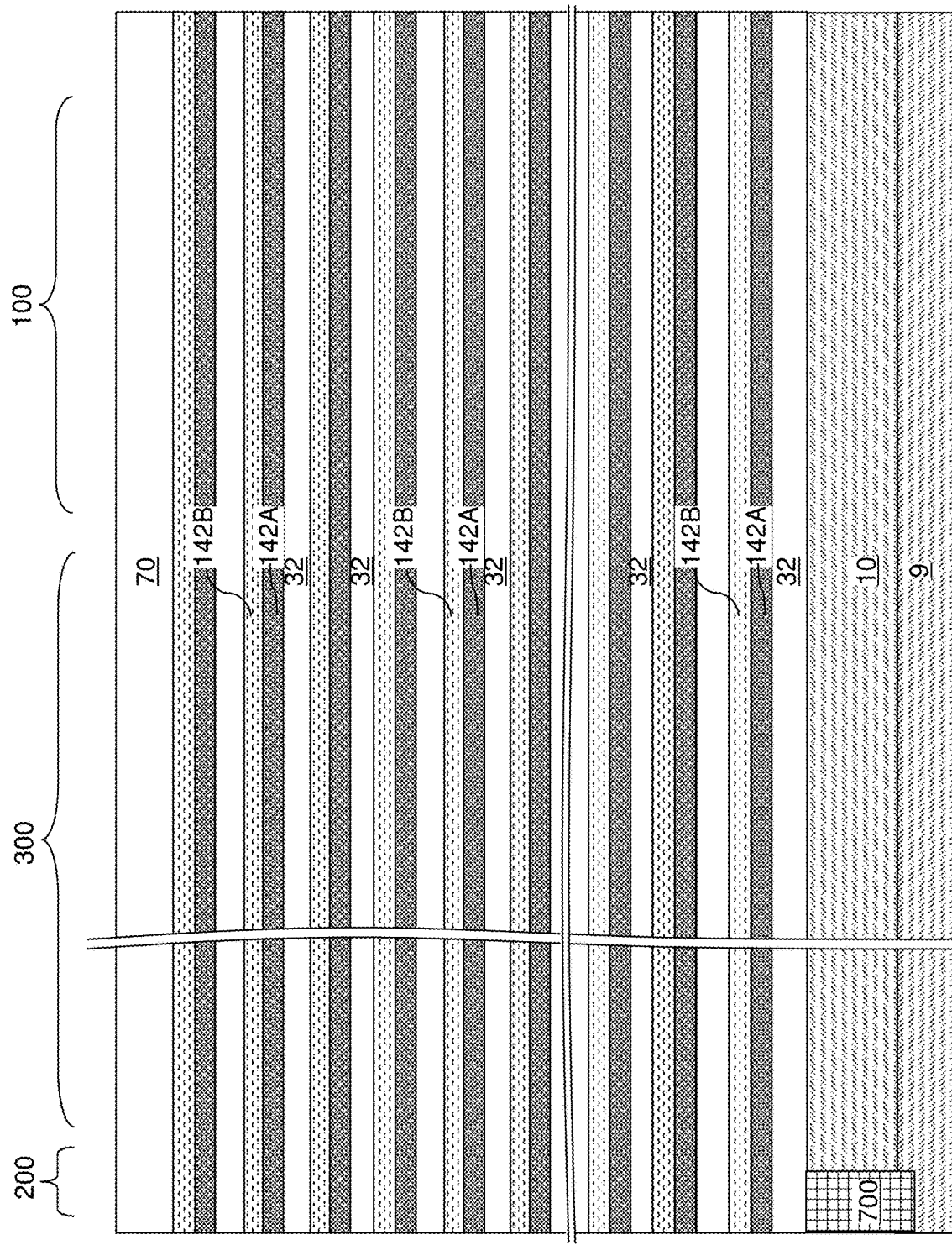
FIG. 16 is a schematic vertical cross-sectional view of a second exemplary structure after formation of a vertical sequence of a unit layer stack each including a first sacrificial material layer, a second sacrificial material layer, and an insulating layer according to a second embodiment of the present disclosure.

Referring to FIG. 16, a second exemplary structure can be derived from the first exemplary structure illustrated in FIG. 1 by forming a vertical sequence of a unit layer stack (32, 142A, 142B) over the semiconductor material layer 10. Each unit layer stack (32, 142A, 142B) can include, from bottom to top, an insulating layer 32, a first sacrificial material layer 142A, and a second sacrificial material layer 142B. Alternatively, each unit layer stack (32, 142A, 142B) can include, from bottom to top, a first sacrificial material layer 142A, a second sacrificial material layer 142B, and an insulating layer 32. The first sacrificial material layers 142A, the second sacrificial material layers 142B, and the insulating layers 32 include different materials. Thus, the second sacrificial material layers 142B have a different material composition than the first sacrificial material layers 142A. The materials of the first sacrificial material layers 142A, the second sacrificial material layers 142B, and the insulating layers 32 are selected such that the first sacrificial material layers 142A can be isotropically etched selective to the insulating layers 32 and the second sacrificial material layers 142B, or the second material layers 142B can be removed selective to the material of the insulating layers 32 and the first sacrificial material layers 142A.

In one embodiment, the insulating layers 32 can include undoped silicate glass or a doped silicate glass, the first sacrificial material layers 142A can include silicon nitride, and the second sacrificial material layers 142B can include a semiconductor material (such as amorphous silicon, polysilicon, or silicon-germanium). In another embodiment, the insulating layers 32 can include undoped silicate glass or a doped silicate glass, the first sacrificial material layers 142A can include a semiconductor material, and the second sacrificial material layers 142B can include silicon nitride. In another embodiment, the insulating layers 32 can include undoped silicate glass or a doped silicate glass, first sacrificial material layers 142A can include more porous silicon nitride, and the second sacrificial material layers 142B can include less porous or non-porous silicon nitride having a lower etch rate than the porous silicon nitride of the first sacrificial material layers 142A.

The thicknesses of each insulating layers 32 can be in a range from 20 nm to 50 nm, although lesser and greater thicknesses can also be employed. The thickness of each of the first sacrificial material layers 142A and the second sacrificial material layers 142B can be in a range from 8 nm to 30 nm, such as from 10 nm to 20 nm, although lesser and greater thicknesses may also be employed. The number of repetitions of the unit layer stack (32, 142A, 142B) with the vertically sequence can be in a range from 2 to 1,024, and typically from 8 to 256, although a greater number of repetitions can also be employed. In one embodiment, each layer within the vertical sequence can have a uniform thickness that is substantially invariant within lateral translation.

Optionally, an insulating cap layer 70 can be formed over the vertical sequence (32, 142A, 142B). The insulating cap layer 70 includes a dielectric material that is different from the material of the sacrificial material layers 142. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 17:
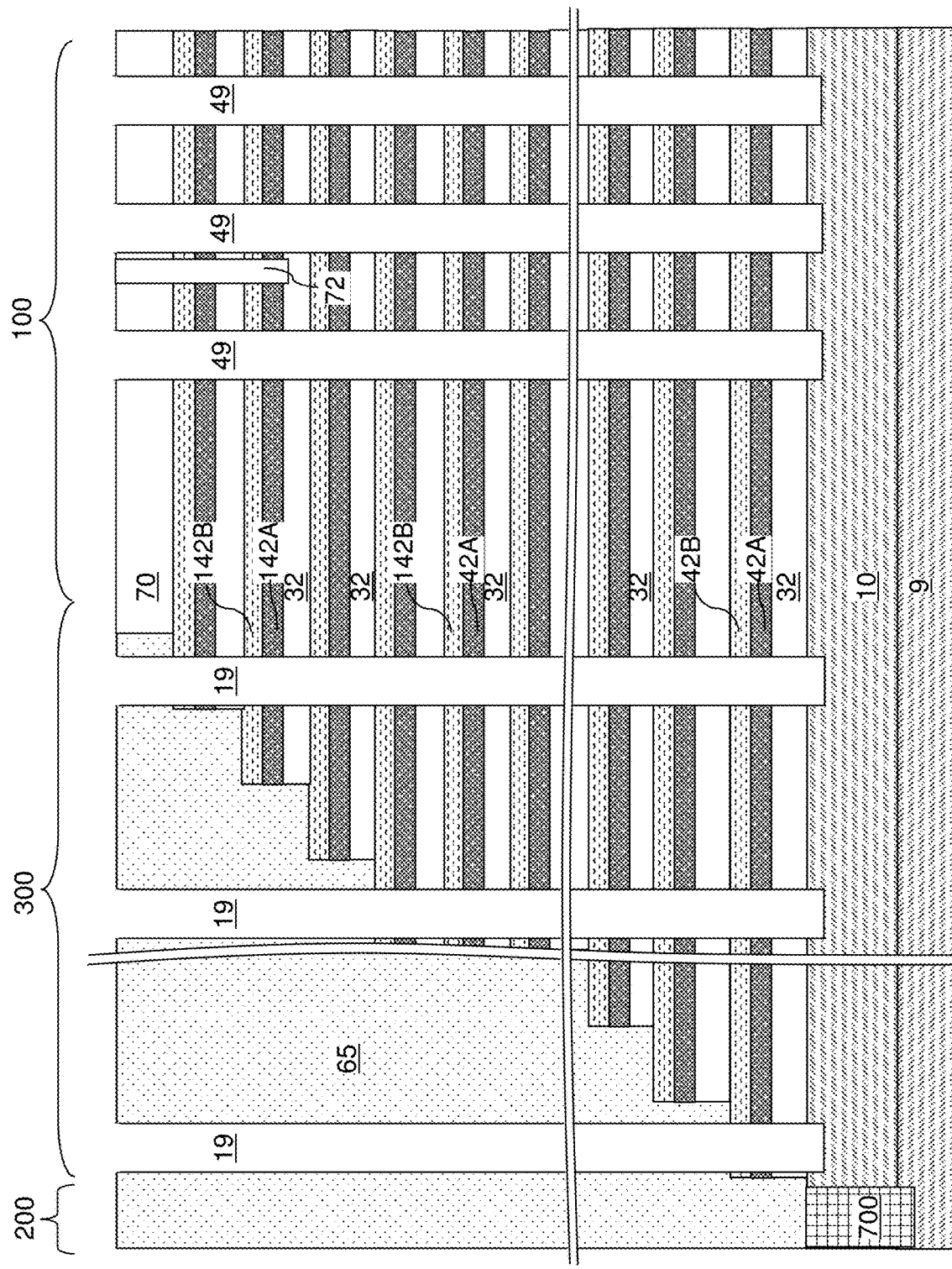
FIG. 17 is a schematic vertical cross-sectional view of the second exemplary structure after formation of stepped terraces, a retro-stepped dielectric material portion, memory openings, and support openings according to the second embodiment of the present disclosure.

Referring to FIG. 17, the processing steps of FIGS. 3, 4A, and 4B can be performed to form memory openings 49 and support openings 19. The etch chemistry of the anisotropic etch process employed to form the memory openings 49 and the support openings 19 can be modified as needed to vertically extend each of the memory openings 49 and the support openings 19 at least to a horizontal plane including the bottommost surface of the vertical sequence (32, 142A, 142B).

FIGS. 18A-18H are sequential schematic vertical cross-sectional views of a memory opening within the second exemplary structure during formation of a memory opening fill structure according to the second embodiment of the present disclosure.

Figure 18A:
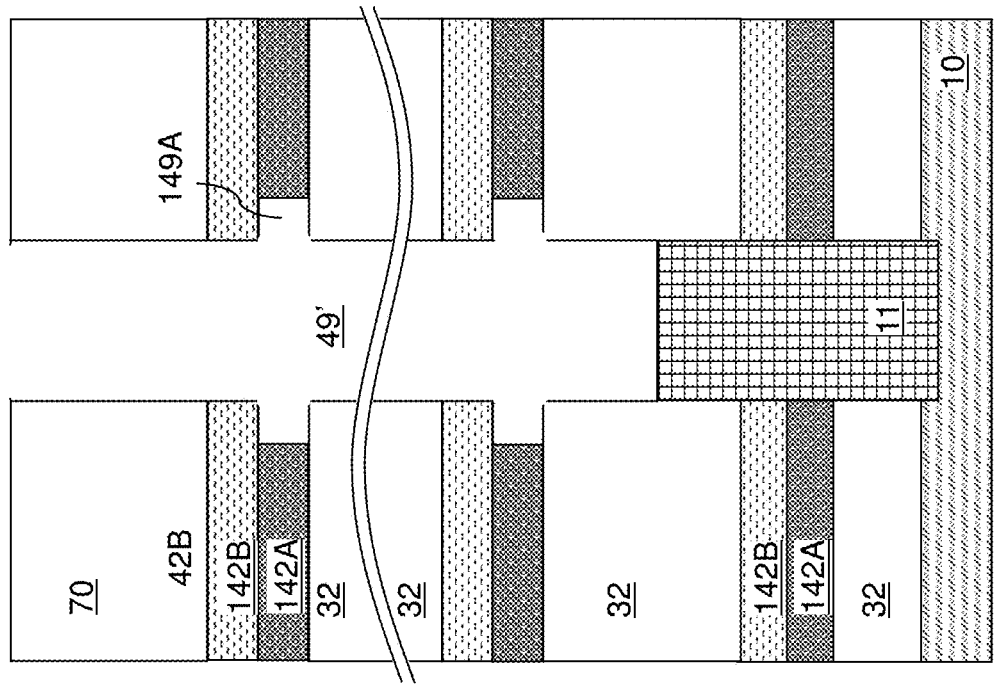

Referring to FIG. 18A, a memory opening 49 in the second exemplary structure is illustrated after formation of the memory openings 49 and the support openings 19. The memory opening 49 extends through the insulating cap layer 70, the vertical sequence (32, 142A, 142B), and optionally into an upper portion of the semiconductor material layer 10. At this processing step, each support opening 19 can extend through the retro-stepped dielectric material portion 65, a subset of layers in the vertical sequence (32, 142A, 142B), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. An optional pedestal channel portion (e.g., an epitaxial pedestal) 11 can be formed at the bottom portion of each memory opening 49 and each support openings 19, for example, by selective epitaxy. The same processing steps may be employed as the processing steps of FIG. 5B.

Figure 18B:
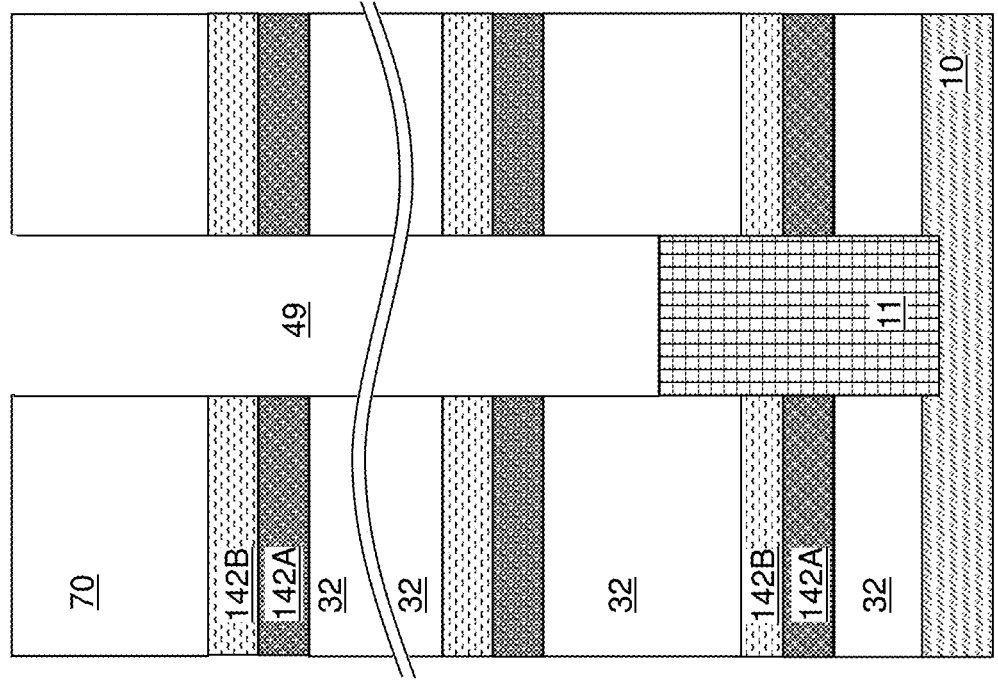

Referring to FIG. 18B, first lateral recesses 149A are formed by performing a first isotropic etch process that etches the material of the first sacrificial material layers 142A selective to materials of the second sacrificial material layers 142B and the insulating layers 32. For example, if the insulating layers 32 comprise undoped silicate glass or a doped silicate glass, if the second sacrificial layers 142B comprise a semiconductor material, and if the first sacrificial material layers 142A comprise silicon nitride, the isotropic etch process can include a wet etch process employing hot phosphoric acid. If the insulating layers 32 comprise undoped silicate glass or a doped silicate glass, if the second sacrificial material layers 142B comprise silicon nitride, and if the first sacrificial material layers 142A comprise a semiconductor material, the isotropic etch process can include a wet etch process employing hot trimethyl-2 hydroxyethyl ammonium hydroxide ("hot TMY") or tetramethyl ammonium hydroxide (TMAH). If the insulating layers 32 comprise undoped silicate glass or a doped silicate glass, if the second sacrificial material layers 142B comprise less porous or non-porous silicon nitride, and if the first sacrificial material layers 142A comprise more porous silicon nitride, the isotropic etch process can include a wet etch process employing dilute HF (e.g., 100:1 HF). First lateral recesses 149A are formed in volumes from which surface portions of the first sacrificial material layers 142A are isotropically etched.

Figure 18D:
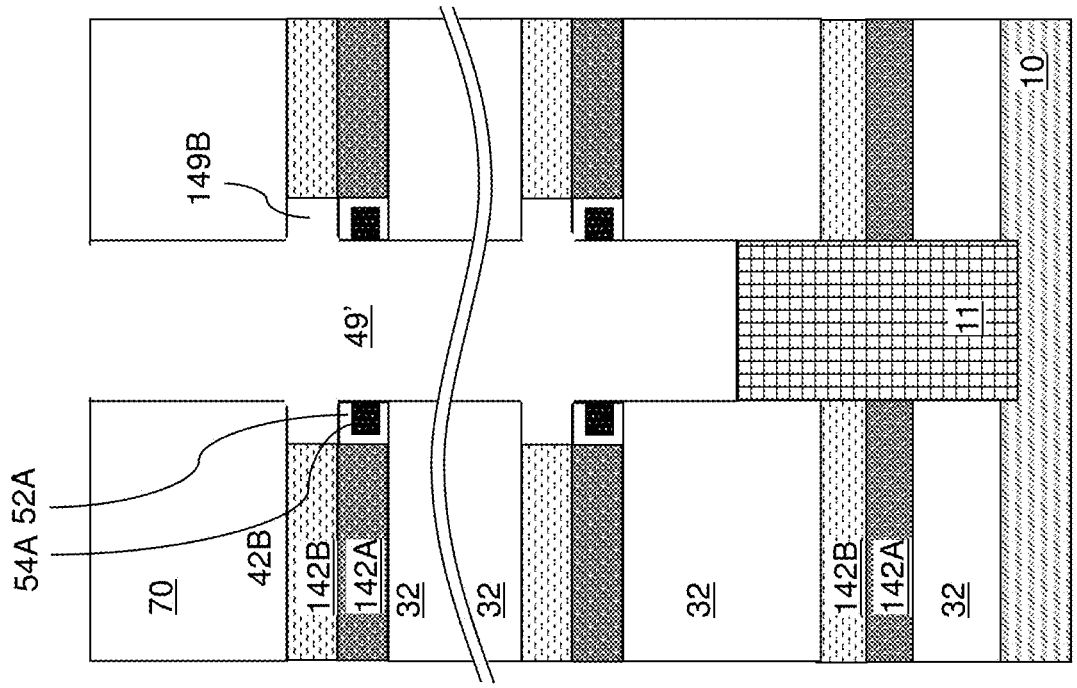
Figure 18C:
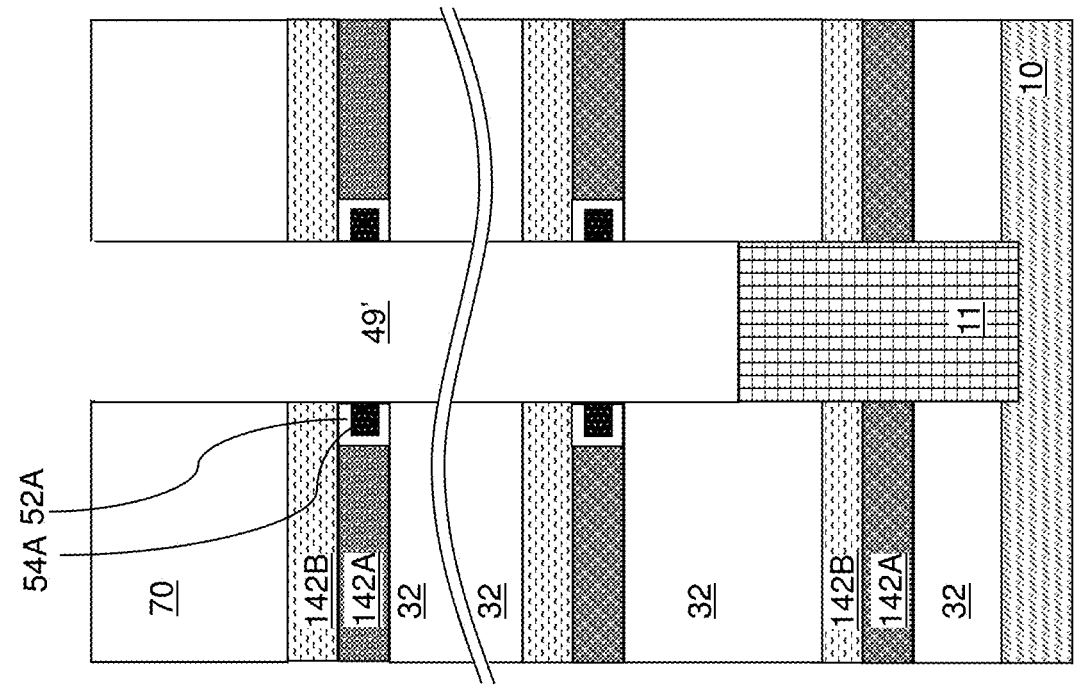

Referring to FIG. 18C, a first blocking dielectric layer and a first memory material layer can be deposited in the first lateral recesses 149, and can be anisotropically etched to remove portions of the first blocking dielectric layer and the first memory material layer from inside the memory openings 49 and the support openings 19, and from above the insulating cap layer 70. Each remaining portion of the first blocking dielectric layer constitutes a first blocking dielectric liner 52A, and each remaining portion of the first memory material layer constitutes a first memory material portion 54A. The first blocking dielectric liners 52A can have the same material composition and the same thickness range as the first and second blocking dielectric liners 52B in the first exemplary structure. The first memory material portions 54A can have the same material composition and the same range for lateral thickness (i.e., the lateral distance between an inner sidewall and an outer sidewall) as the first and second memory material portions (54A, 54B) in the first exemplary structure.

Referring to FIG. 18D, second lateral recesses 149B are formed by performing a second isotropic etch process that etches the material of the second sacrificial material layers 142B selective to materials of the insulating layers 32, the first blocking dielectric liners 52A, and the first memory material portions 54A. For example, if the insulating layers 32 comprise undoped silicate glass or a doped silicate glass, and if the second sacrificial material layers 142B comprise silicon nitride, the isotropic etch process can include a wet etch process employing hot phosphoric acid. In this embodiment, the first memory material portions 54A may comprise a material other than silicon nitride, such as a semiconductor or conductive floating gate material. If the insulating layers 32 comprise undoped silicate glass or a doped silicate glass, and if the second sacrificial material layers 142B comprise a semiconductor material, the isotropic etch process can include a wet etch process employing hot trimethyl-2 hydroxyethyl ammonium hydroxide ("hot TMY") or tetramethyl ammonium hydroxide (TMAH). Second lateral recesses 149B are formed in volumes from which surface portions of the second sacrificial material layers 42B are isotropically etched.

Referring to FIG. 18E, a second blocking dielectric layer and a second memory material layer can be deposited in the second lateral recesses 149B, and can be anisotropically etched to remove portions of the second blocking dielectric layer and the second memory material layer from inside the memory openings 49 and the support openings 19, and from above the insulating cap layer 70. Each remaining portion of the second blocking dielectric layer constitutes a second blocking dielectric liner 52B, and each remaining portion of the second memory material layer constitutes a second memory material portion 54B. The second blocking dielectric liners 52B may have the same material composition as, or may have a different material composition from, the first blocking dielectric liners 52A. The second blocking dielectric liners 52B may have the same thickness as, or may have a different thickness from, the first blocking dielectric liners 52A. The second memory material portions 54B may have the same material composition as, or may have a different material composition from, the first memory material portions 54A. The second memory material portions 54B may have the same lateral thickness (i.e., the lateral distance between the inner sidewall and the outer sidewall) as, or may have a different thickness from, the first memory material portions 54A, as described above with respect to the first embodiment.

Generally, first lateral recesses 149A can be formed by laterally recessing each of the first sacrificial material layers 142A around each of the memory openings 49, and second lateral recesses 149B can be formed by laterally recessing each of the second sacrificial material layers 142B around each of the memory openings 49 prior to, or after, formation of the first lateral recesses 149A. In one embodiment, the first sacrificial material layers 142A and the second sacrificial material layers 142B comprise different sacrificial materials, and the first lateral recesses and the second lateral recesses are formed sequentially in separate isotropic etch processes that sequentially laterally recess the first sacrificial material layers and the second sacrificial material layers.

Referring to FIG. 18F, the processing steps of FIG. 5F can be performed to form a tunneling dielectric layer 56 and a sacrificial cover layer 601.

Figure 18H:
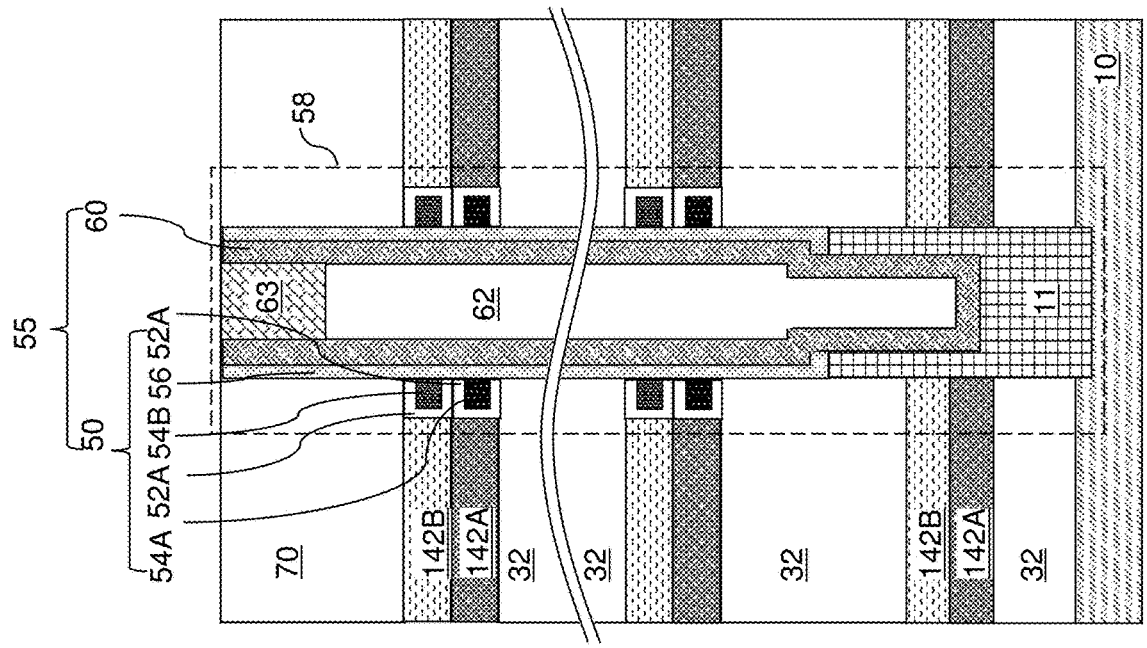
Figure 18G:
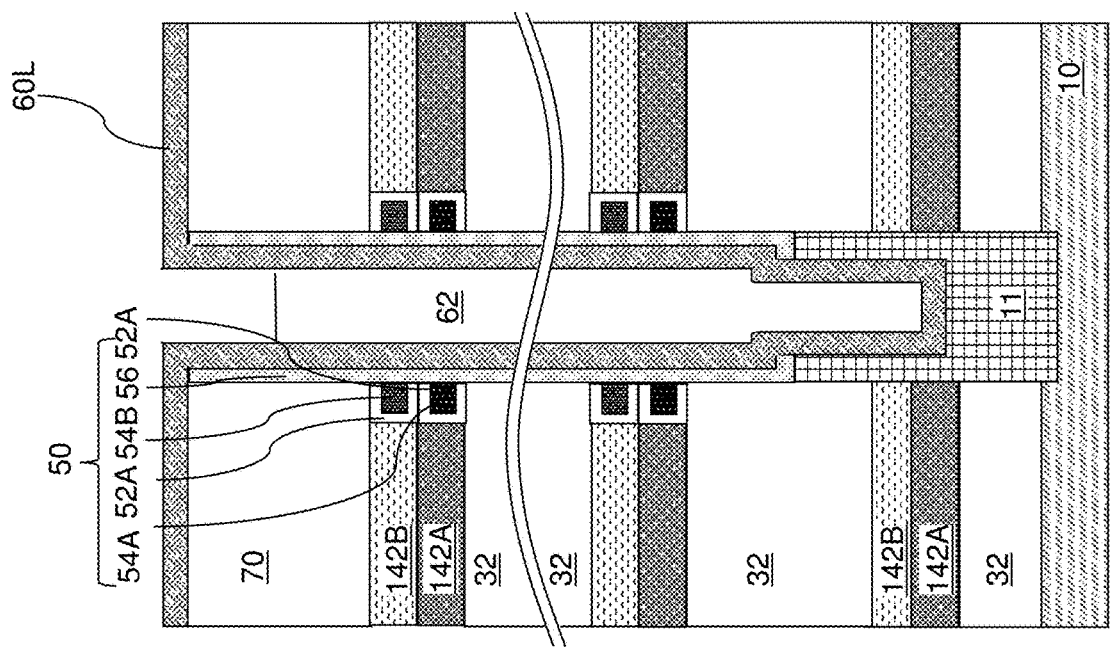

Referring to FIG. 18G, the processing steps of FIGS. 5G, 5H, and 5I can be performed to form a semiconductor channel layer 60L and dielectric cores 62.

Referring to FIG. 18H, the processing steps of FIG. 5J can be performed to form drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the memory material layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 19A:
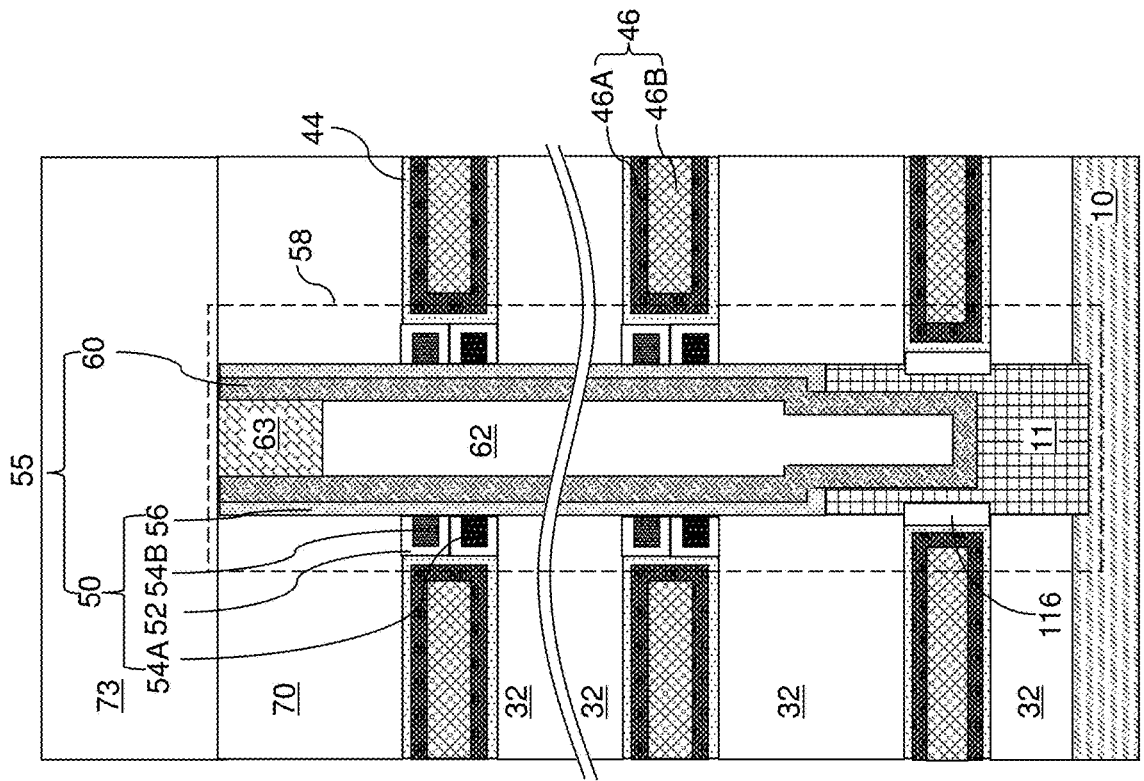
FIGS. 19A and 19B are sequential vertical cross-sectional views of a region around a memory opening fill structure of the second exemplary structure during formation of electrically conductive layers according to the second embodiment of the present disclosure.

Referring to FIG. 19A, the processing steps of FIGS. 7A-9A can be performed with a modification in the etch chemistry of the isotropic etch process employed to form the backside recesses 43. In this case, removal of the first sacrificial material layers 142A and removal of the second sacrificial material layers 142B can be performed sequentially by performing two isotropic etch processes that sequentially etch the first sacrificial material layers 142A or the second sacrificial material layers 142B selective to the materials of the insulating layers 32, the first blocking dielectric liners 52A, and the second blocking dielectric liners 52B.

Figure 19B:
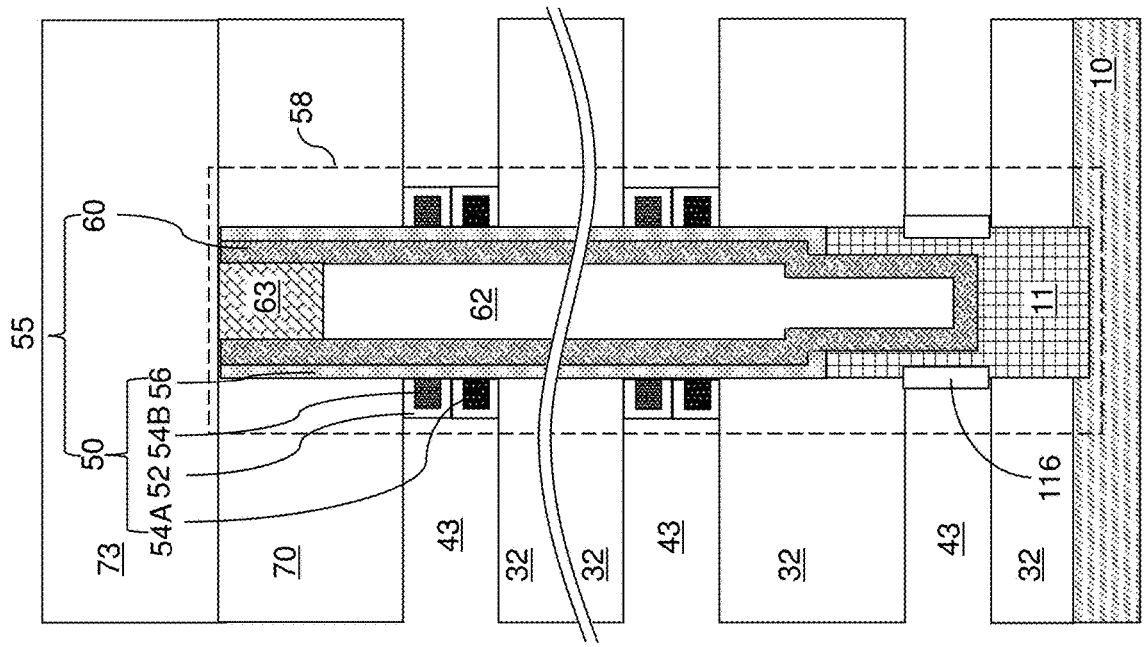

Referring to FIG. 19B, the processing steps of FIGS. 9B, 10, 11A, and 11B can be performed to form a backside blocking dielectric layer 44 and electrically conductive layers 46.

Subsequently, the processing steps of FIGS. 12A-13B can be performed.

Generally, a multi-bit charge storage element of the embodiments present disclosure can include a pair of a first memory material portion 54A and a second memory material portion 54B. The pair of the first memory material portion 54A and the second memory material portion 54B can be vertically spaced from each other by the at least one blocking dielectric material portion. In one embodiment, the at least one dielectric material portion comprises a first blocking dielectric liner 52A contacting a top surface, a bottom surface, and an outer sidewalls of the first memory material portion 54A, and a second blocking dielectric liner 52B contacting a top surface, a bottom surface, and an outer sidewall of the second memory material portion 54B.

In one embodiment, the first blocking dielectric liner 52A and the second blocking dielectric liner 52B differ from each other at least in one of thickness and material composition. In one embodiment, the first memory material portion 54A and the second memory material portion 54B have a same lateral thickness and a same material composition or a different lateral thickness and/or a different material composition. In one embodiment, an annular top surface of the first blocking dielectric liner 52A contacts an annular bottom surface of the second blocking dielectric liner 52B.

FIGS. 20A-20D illustrate the operational principle of a multi-bit charge storage element of the present disclosure employing an exemplary unit cell structure according to an embodiment of the present disclosure. The unit cell structure is rotated 90 degrees compared to the unit cell structure shown in FIG. 9B, 15B or 19B.

Figure 20B:
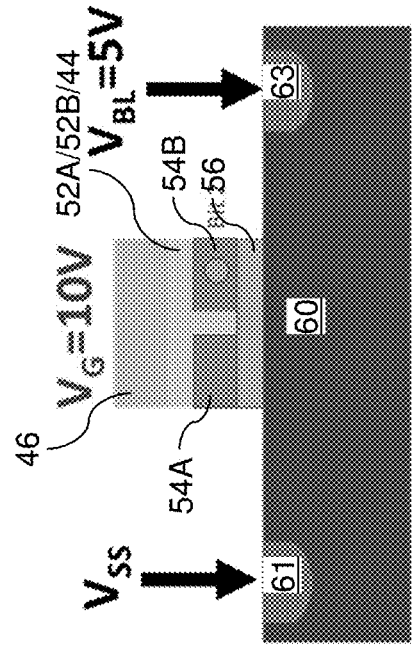
FIGS. 20A-20D illustrate the operational principle of a multi-bit charge storage element of the present disclosure employing an exemplary unit cell structure according to an embodiment of the present disclosure.
Figure 20D:
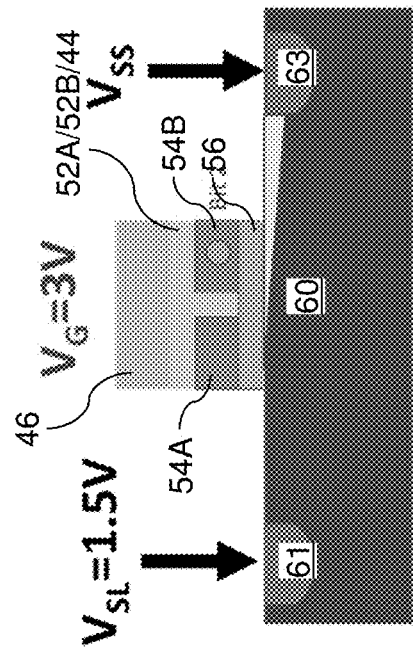
Figure 20A:
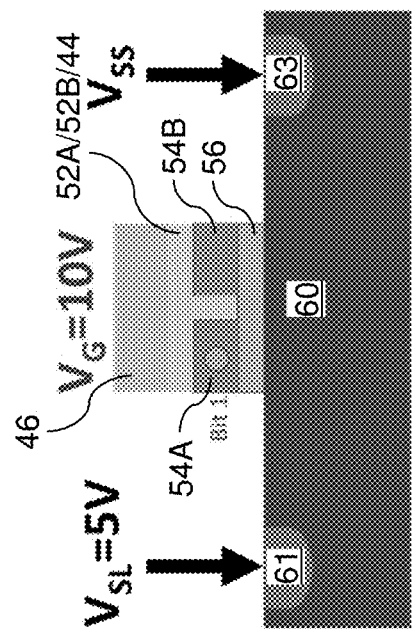

Referring to FIG. 20A, an exemplary multi-bit charge storage element including a first memory material portion 54A and a second memory material portion 54B is illustrated. A tunneling dielectric layer 56 can be provided between a semiconductor channel 60 and the combination of the first memory material portion 54A and the second memory material portion 54B. A blocking dielectric (which is equivalent to the combination of a first blocking dielectric liner 52A, a second blocking dielectric liner 52B, and a backside blocking dielectric layer 44) can be disposed between the gate electrode 46 and the combination of the first memory material portion 54A and the second memory material portion 54B. A programming voltage (such as 10 V) can be applied to an electrically conductive layer 46 that functions as a control gate electrode. Programming of the first memory material portion 54A can be performed by inducing charge injection into the first memory material portion 54A. For example, a positive programming voltage (such as 5 V) can be applied to the source region 61, and the drain region 63 can be electrically grounded (i.e., applied with 0 V). An erase operation on the first memory material portion 54A can be performed by applying an erase voltage of a negative polarity to the source region 61.

Referring to FIG. 20B, programming of the second memory material portion 54B can be performed by inducing charge injection into the second memory material portion 54B. For example, a programming voltage (such as 10 V) can be applied to the control gate electrode 46, a positive programming voltage (such as 5 V) can be applied to the drain region 63, and the source region 61 can be electrically grounded (i.e., applied with 0 V). An erase operation on the second memory material portion 54B can be performed by applying an erase voltage of a negative polarity to the drain region 63.

Figure 20C:
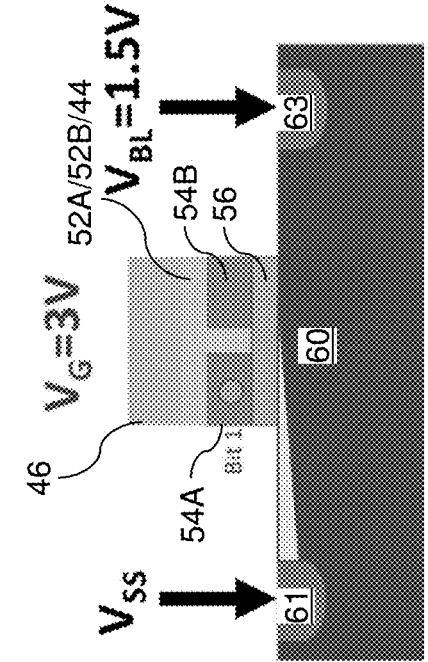

Referring to FIG. 20C, a read operation on the first memory material portion 54A can be performed by applying a read gate voltage (such as 3 V) to the control gate electrode 46. The source region 61 can be electrically grounded, and the drain region 63 can be electrically biased with a read channel bias voltage (such as 1.5 V). The magnitude of the electrical current passing through semiconductor channel 60 can be measured to determine the charge state of the first memory material portion 54A.

Referring to FIG. 20D, a read operation on the second memory material portion 54B can be performed by applying a read gate voltage (such as 3 V) to the control gate electrode 46. The drain region 63 can be electrically grounded, and the source region 63 can be electrically biased with a read channel bias voltage (such as 1.5 V). The magnitude of the electrical current passing through semiconductor channel 60 can be measured to determine the charge state of the second memory material portion 54B.

Figure 21:
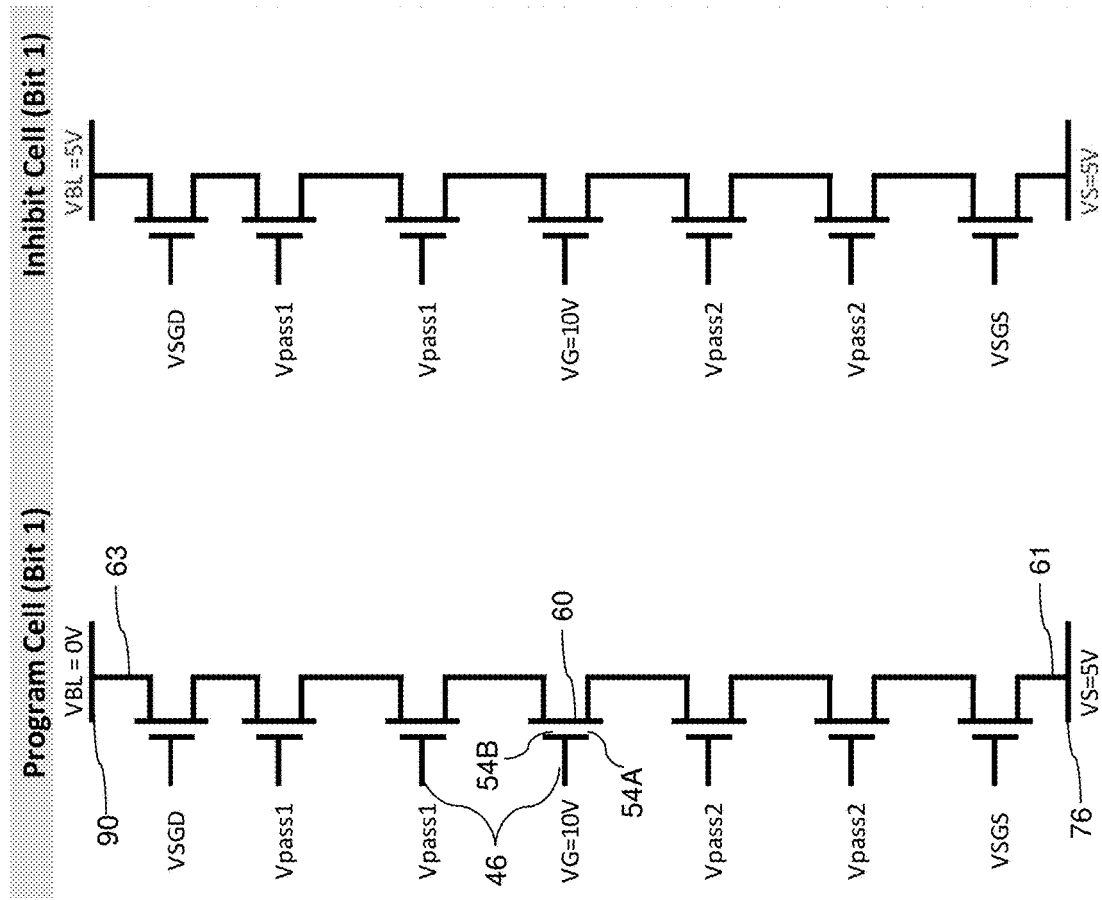
FIG. 21 illustrates circuit diagrams during programming of a first memory material portion encoding a first data bit according to an embodiment of the present disclosure.

Referring to FIG. 21, circuit diagrams illustrate bias voltage conditions during programming of a first memory material portion 54A, i.e., during encoding a first data bit within a selected first memory material portion 54A in a selected memory string (labeled "Program Cell (Bit 1)," which can comprise a respective memory stack structure 55 in the first exemplary structure or in the second exemplary structure. The electrically conductive layer (i.e., word line/control gate electrode) 46 that is adjacent to the selected multi-bit memory element can be biased at the programming voltage (such as 10 V), unselected word lines (comprising other electrically conductive layers 46) can be electrically biased at a pass voltage (Vpass1 or Vpass2 that is lower than the programming voltage (e.g., 2 V)) to enable passage of electrical current through the vertical semiconductor channel 60 without inducing programming of adjacent memory material portions (54A, 54B), and the select gate electrodes can be electrically biased at respective select gate voltages (e.g., VSGS and VS GD) to enable flow of electrical current through the vertical semiconductor channel 60. The source region 61 can be electrically biased at a positive programming voltage (such as 5 V) by applying the programming voltage to the contact via structure 76. A selected drain region 63 connected to the selected memory string containing the selected memory cell to be programmed can be grounded (e.g., electrically biased at 0 V) by grounding the selected bit line 90.

During the inhibit step, (labeled "Inhibit Cell (Bit 1)," the positive programming voltage (e.g., 5V) is also applied to the drain region 63 of the selected string by applying the positive programming voltage to the selected bit line. In an alternative embodiment, the contact via structure 76 and the common source region 61 for plural strings can be replaced by virtual source lines which comprise electrically conductive lines which are connected to the source sides of the strings and which may extend in the second horizontal direction hd2 parallel to the bit lines 90. In this alternative embodiment, both the selected source line and the selected bit line 90 may be grounded (e.g., by applying 0V to both) during the inhibit step.

Figure 22:
FIG. 22 illustrates circuit diagrams during programming of a second memory material portion encoding a second data bit according to an embodiment of the present disclosure.

Referring to FIG. 22, circuit diagrams illustrate bias voltage conditions during programming of a second memory material portion 54B, i.e., during encoding a second data bit within a selected second memory material portion 54B in a selected string (labeled "Program Cell (Bit 2)," which may comprise a respective memory stack structure 55 in the first exemplary structure or in the second exemplary structure. The electrically conductive layer 46 that is adjacent to the selected multi-bit memory element can be biased at the programming voltage (e.g., 10 V), unselected word lines (comprising other electrically conductive layers 46) can be electrically biased at a pass voltage (Vpass1 or Vpass2 that is lower than the programming voltage (e.g., 2 V)) to enable passage of electrical current through the vertical semiconductor channel 60 without inducing programming of adjacent memory material portions (54A, 54B), and the select gate electrodes can be electrically biased to the respective select gate voltages to enable flow of electrical current through the vertical semiconductor channel. The source region 61 can be grounded (e.g., electrically biased at 0 V) by grounding the contact via structure 76 or a virtual source line described above (if present). The selected drain region 63 of the selected string containing the selected memory cell to be electrically biased at positive programming voltage (such as 5 V) by biasing the selected bit line 90 to this voltage. The inhibit step is the same as the one described above with respect to programming the first memory material portion 54A.

Figure 23:
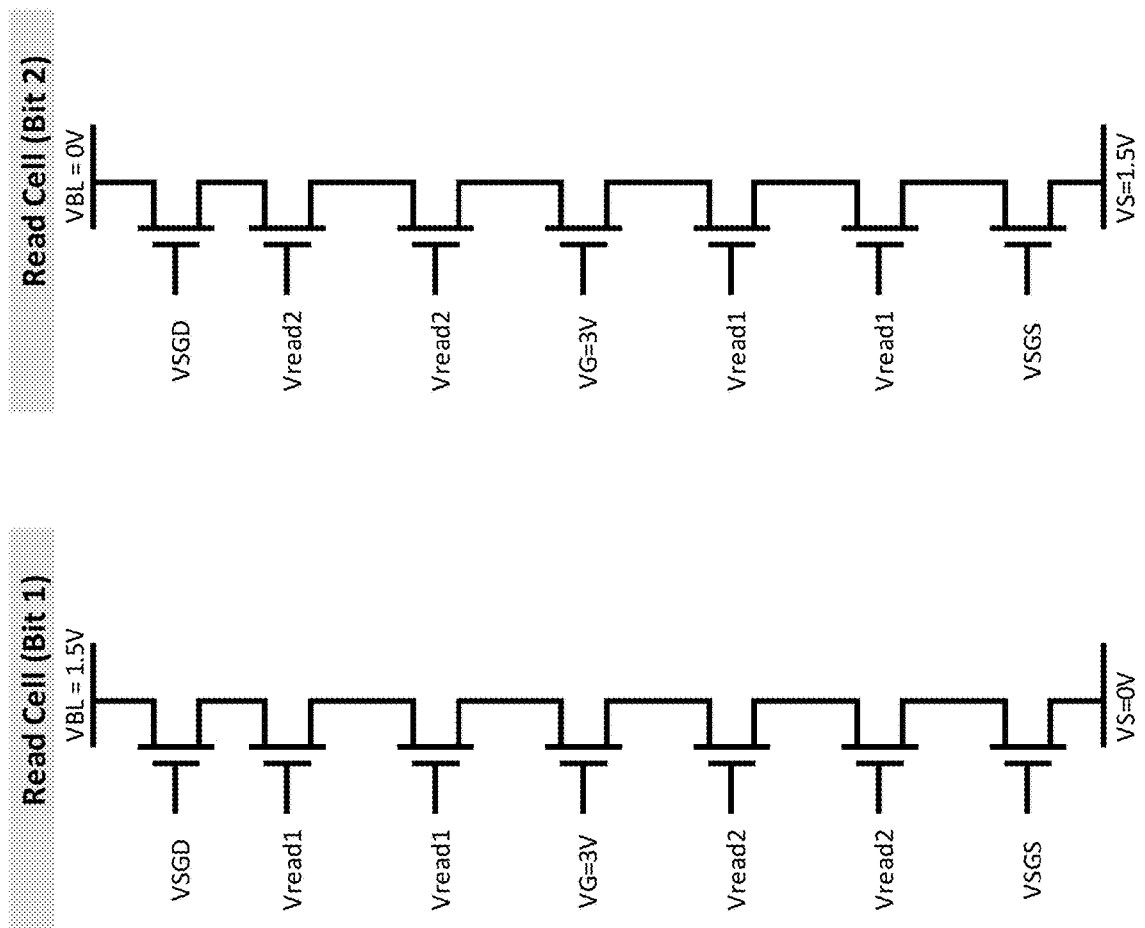
FIG. 23 illustrates circuit diagrams during reading of a first memory material portion and a second memory material portion, respectively, according to an embodiment of the present disclosure.

Referring to FIG. 23, a first circuit diagram (labeled "Read Cell (Bit 1)") illustrates bias voltage conditions during reading of a first memory material portion 54A in a selected string, and a second circuit diagram (labeled "Read Cell (Bit 2)") illustrates bias voltage conditions during reading of a second memory material portion 54B in a selected string. Each multi-bit memory element can be read by sequentially performing two read operations employing the scheme illustrated in the first circuit diagram and in the second circuit diagram. The electrically conductive layer (e.g., the selected control gate electrode/word line) 46 that is adjacent to the selected multi-bit memory element can be biased at a read gate voltage (e.g., 3 V which is lower than the programming voltage), unselected word lines (comprising other electrically conductive layers 46) can be electrically biased at a read voltage to enable passage of electrical current through the vertical semiconductor channel 60, and the select gate electrodes can be electrically biased to the respective select gate voltage to enable flow of electrical current through the vertical semiconductor channel 60. During a first read operation that measures the electrical charge stored in the first memory material portion 54A of the selected multi-bit memory element, the source region 61 is grounded (e.g., biased at 0 V) and the drain region 63 is biased at a read voltage (e.g., 1.5 V) which is lower than the positive programming voltage and the read gate voltage. During a second read operation that measures the electrical charge stored in the second memory material portion 54B of the selected multi-bit memory element, the source region 61 is biased at the read voltage (e.g., 1.5 V) and the drain region 63 is grounded (e.g., biased at 0 V).

The three dimensional memory device (e.g., NROM) of embodiments of the present disclosure includes plural multi-bit memory cells (e.g., multi-level cell). The bits can be physically confined by splitting each word line into two half-cells. Such NROM can provide much faster programming ($t_{prog} \approx 30$ microsec) compared to multi-level three dimensional NAND ($t_{prog} > 200$ microsec). Thus, NROM of the embodiments provides a relatively low operating voltage, fast read and write operations and higher endurance. One bit does not affect the information of the other bit since the bits are physically isolated. While a two bit memory cell is illustrated, the NROM may be extended to 4 bits/cell and higher.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    an alternating stack of insulating layers and electrically conductive layers located over a substrate;
    memory stack structures extending through the alternating stack, wherein each of the memory stack structures comprises a vertical semiconductor channel, a tunneling dielectric layer, and a vertical stack of memory elements located at levels of the electrically conductive layers between a respective vertically neighboring pair of the insulating layers,
    wherein each of the memory elements is located at a level of a respective one of the electrically conductive layers between the respective vertically neighboring pair of the insulating layers, and each of the memory elements comprises:
    a first memory material portion; and
    a second memory material portion that is vertically spaced from and is electrically isolated from the first memory material portion by at least one blocking dielectric material portion.

2. The three-dimensional memory device of claim 1, wherein the at least one blocking dielectric material portion comprises a laterally protruding portion of a backside blocking dielectric layer that is in direct contact with one of the electrically conductive layers.

3. The three-dimensional memory device of claim 2, wherein the backside blocking dielectric layer comprises:
   a first horizontally-extending portion that contacts a top surface of the one of the electrically conductive layers;
   a second horizontally-extending portion that contacts a bottom surface of the one of the electrically conductive layers; and
   a plurality of vertically extending portions that connect the first horizontally-extending portion and the second horizontally extending portion,
   wherein the laterally protruding portion of the backside blocking dielectric layer is adjoined to a middle section of one of the plurality of vertically extending portions.

4. The three-dimensional memory device of claim 3, wherein:
   each of the plurality of vertically extending portions of the backside blocking dielectric layer laterally surrounds a respective one of the memory stack structures and has a respective cylindrical configuration; and
   the laterally protruding portion contacts a cylindrical segment of an outer sidewall of the tunneling dielectric layer.

5. The three-dimensional memory device of claim 2, wherein the at least one blocking dielectric material portion comprises:
   a first blocking dielectric liner contacting a top surface, a bottom surface, and an outer sidewall of the first memory material portion and contacting a bottom surface of the laterally protruding portion of the backside blocking dielectric layer; and
   a second blocking dielectric liner contacting a top surface, a bottom surface, and an outer sidewall of the second memory material portion and contacting a top surface of the laterally protruding portion of the backside blocking dielectric layer.

6. The three-dimensional memory device of claim 1, wherein the at least one blocking dielectric material portion comprises:
   a first blocking dielectric liner contacting a top surface, a bottom surface, and an outer sidewall of the first memory material portion; and
   a second blocking dielectric liner contacting a top surface, a bottom surface, and an outer sidewall of the second memory material portion.

7. The three-dimensional memory device of claim 6, wherein:
   the first blocking dielectric liner comprises a top annular portion overlying the first memory material portion and contacting the tunneling dielectric layer, a bottom annular portion underlying the first memory material portion and contacting the tunneling dielectric layer, and a cylindrical portion connecting the top annular portion and the bottom annular portion of the first blocking dielectric liner; and
   the second blocking dielectric liner comprises a top annular portion overlying the second memory material portion and contacting the tunneling dielectric layer, a bottom annular portion underlying the second memory material portion and contacting the tunneling dielectric layer, and a cylindrical portion connecting the top annular portion and the bottom annular portion of the second blocking dielectric liner.

8. The three-dimensional memory device of claim 6, wherein an annular top surface of the first blocking dielectric liner contacts an annular bottom surface of the second blocking dielectric liner.

9. The three-dimensional memory device of claim 6, wherein the first blocking dielectric liner and the second blocking dielectric liner have a same uniform thickness and a same material composition throughout.

10. The three-dimensional memory device of claim 6, wherein the first blocking dielectric liner and the second blocking dielectric liner differ from each other at least in one of thickness and material composition.

11. The three-dimensional memory device of claim 1, wherein the first memory material portion and the second memory material portion have a same lateral thickness and a same material composition.

12. The three-dimensional memory device of claim 1, wherein the first memory material portion and the second memory material portion differ in lateral thicknesses, in material composition, or both in lateral thicknesses and in material composition.

13. The three-dimensional memory device of claim 1, wherein the first memory material portion comprises an electrically conductive floating gate and the second memory material portion comprises a discrete silicon nitride material portion.

* * * * *